(12) United States Patent
Shimizu

(10) Patent No.: US 10,455,172 B2
(45) Date of Patent: Oct. 22, 2019

(54) IMAGE SENSOR

(71) Applicant: Renesas Electronics Corporation, Tokyo (JP)

(72) Inventor: Hirokazu Shimizu, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 0 days.

(21) Appl. No.: 15/984,589

(22) Filed: May 21, 2018

(65) Prior Publication Data

US 2019/0007634 A1 Jan. 3, 2019

(30) Foreign Application Priority Data

Jun. 29, 2017 (JP) ................................. 2017-127219

(51) Int. Cl.
*H04N 5/217* (2011.01)
*H04N 9/64* (2006.01)
(Continued)

(52) U.S. Cl.
CPC ..... *H04N 5/3658* (2013.01); *H01L 27/14621* (2013.01); *H01L 27/14645* (2013.01);
(Continued)

(58) Field of Classification Search
CPC .... H04N 5/2176; H04N 5/2178; H04N 5/357; H04N 5/361; H04N 5/376; H04N 5/378
See application file for complete search history.

(56) References Cited

U.S. PATENT DOCUMENTS 6,774,942 B1 * 8/2004 Salcedo ................. H04N 5/361
348/243
7,817,197 B2 * 10/2010 Noguchi ................ H04N 5/372
348/241
(Continued)

FOREIGN PATENT DOCUMENTS

JP 2008-252605 A 10/2008

*Primary Examiner* — Ngoc Yen T Vu
(74) *Attorney, Agent, or Firm* — McDermott Will & Emery LLP

(57) ABSTRACT

Conventional image sensors cannot generate highly-accurate correction values in a short time. In calibration operation, an image sensor according to an embodiment: categorizes a plurality of pixel circuits, which are arranged in a grid of columns and rows in an effective pixel area, on a row-by-row basis into an imaging pixel circuit group and a calibration pixel circuit group; controls the pixel circuits belonging to the imaging pixel circuit group to output imaging signals; electrically cuts off the pixel circuits belonging to the calibration pixel circuit group from vertical readout lines and supplies a calibration voltage to the vertical readout lines at the time when the pixel circuits belonging to the calibration pixel circuit group are read; generates imaging data corresponding to the voltage level of the imaging signal input through the vertical readout lines and calibration data corresponding to the voltage level of the calibration voltage; generates pixel data by applying a correction value to the imaging data while accumulating calibration data; and updates the correction value to an updated correction value generated based on a predetermined number of the calibration data pieces.

7 Claims, 19 Drawing Sheets

(51) Int. Cl.
*H04N 5/365* (2011.01)
*H04N 5/378* (2011.01)
*H04N 5/369* (2011.01)
*H01L 27/146* (2006.01)
*H04N 5/345* (2011.01)
*H04N 5/376* (2011.01)
*H04N 5/355* (2011.01)
*H04N 5/367* (2011.01)
*H04N 3/14* (2006.01)

(52) U.S. Cl.
CPC ......... *H04N 5/345* (2013.01); *H04N 5/35581* (2013.01); *H04N 5/3675* (2013.01); *H04N 5/3698* (2013.01); *H04N 5/378* (2013.01); *H04N 5/3765* (2013.01); *H04N 5/2176* (2013.01)

(56) References Cited

U.S. PATENT DOCUMENTS

| | | | |
|---|---|---|---|
| 8,115,835 B2* | 2/2012 | Noguchi | H03M 1/1019 348/241 |
| 8,264,580 B2 | 9/2012 | Mori et al. | |
| 8,520,101 B2* | 8/2013 | Meng | H04N 5/378 348/241 |
| 8,749,670 B1* | 6/2014 | Liu | H04N 5/361 348/243 |
| 10,104,321 B1* | 10/2018 | Sohn | H04N 5/361 |

* cited by examiner

FIG. 1

| | CALIBRATION (GENERATION OF CORRECTION VALUE) | ADC AUTO-ZERO PROCESS | DARK LEVEL AD CONVERSION PROCESS | IMAGING SIGNAL AD CONVERSION PROCESS | NOISE REMOVAL PROCESS (DIGITAL SIGNAL PROCESSING) |
|---|---|---|---|---|---|
| ANALOG CDS METHOD | NECESSARY | PERFORMED | NOT PERFORMED | PERFORMED | (IMAGING DATA) - (CORRECTION VALUE) |
| DIGITAL CDS METHOD | UNNECESSARY | PERFORMED | PERFORMED | PERFORMED | (IMAGING DATA) - (DARK LEVEL) |

FIG. 2
BLOCK DIAGRAM OF PIXEL-SIGNAL READOUT FLOW
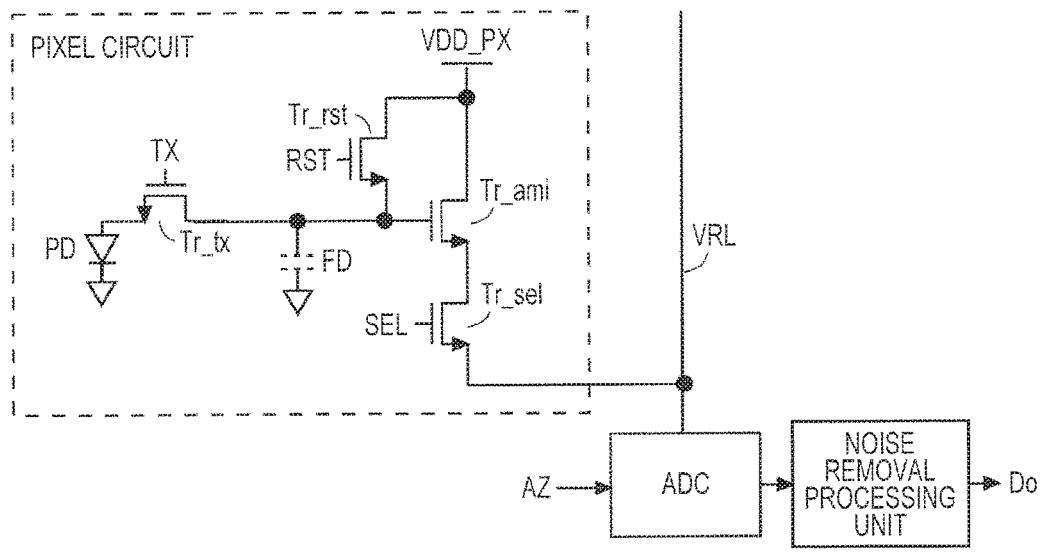
TIMING DIAGRAM OF PIXEL-SIGNAL READOUT PROCESS ACCORDING TO ANALOG CDS METHOD
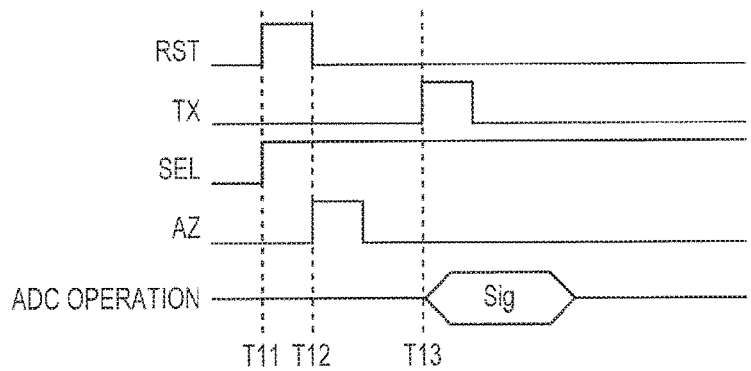
TIMING DIAGRAM OF PIXEL-SIGNAL READOUT PROCESS ACCORDING TO DIGITAL CDS METHOD
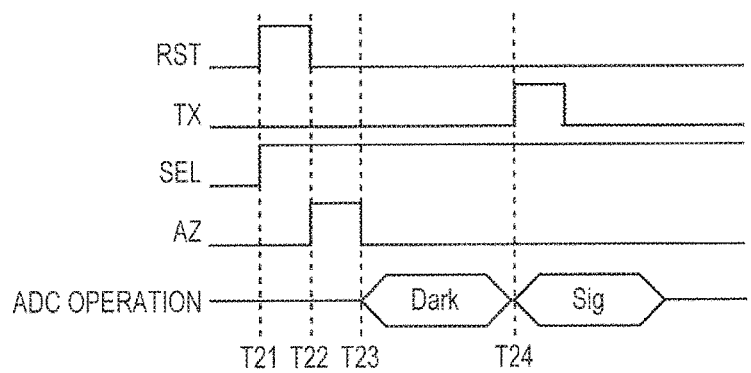

FLOWCHART OF UPDATED CORRECTION VALUE GENERATION PROCESS

IMAGE SENSOR

CROSS REFERENCE TO RELATED APPLICATIONS

The disclosure of Japanese Patent Application No. 2017-127219 filed on Jun. 29, 2017 including the specification, drawings and abstract is incorporated herein by reference in its entirety.

BACKGROUND

This invention relates to image sensors, and, for example, relates to an image sensor that corrects imaging signals read out from a grid of pixel circuits arranged in columns and rows using a correction value generated on a row-by-row basis.

Image sensors generate an imaging signal having a voltage level proportional to the exposure on a photoelectric conversion element provided in a pixel circuit, and generate pixel data by subjecting an analog-digital conversion process or other processes to the imaging signal. This conversion from the imaging signal to the pixel data is made through an analog-digital conversion processing path independently dedicated to each row.

However, circuits making up the analog-digital conversion processing path have characteristics variations, such as input offset variations, and gain variations. The circuit characteristics variations result in fixed pattern noise that causes color shift of pixels in specific rows. An example method for eliminating the fixed pattern noise is disclosed in Japanese Unexamined Patent Application Publication No. 2008-252605.

The solid-state imaging device disclosed in Japanese Unexamined Patent Application Publication No. 2008-252605 uses a first pixel row in an optical black pixel area, which is located on an upper side of a pixel array, as a first correction pixel row for obtaining a correction value of gain×1, and a second pixel row as a second correction pixel row for obtaining a correction value of gain×8. The solid-state imaging device then applies pixel signals obtained from respective pixels on the first and second correction pixel rows to a column processing unit, thereby obtaining correction values of gain×1 and gain×8 for correcting gain errors between the P phase and the D phase, as well as performing correction processing for the gain errors using these correction values with a multiplexer.

SUMMARY

To increase the accuracy of the correction using the first and second correction values, more data is needed to generate the first and second correction values. The solid-state imaging device disclosed in Japanese Unexamined Patent Application Publication No. 2008-252605, however, can only acquire the data for generating the correction values from the pixels arranged in the optical black pixel area, and therefore requires a long time to generate highly-accurate correction values.

Other problems and novel features will become apparent from the following description in the specification and the accompanying drawings.

The image sensor according to an embodiment in calibration operation: categorizes a plurality of pixel circuits, which are arranged in a grid of columns and rows in an effective pixel area, on a row-by-row basis into an imaging pixel circuit group and a calibration pixel circuit group; controls the pixel circuits belonging to the imaging pixel circuit group to output imaging signals; electrically cuts off the pixel circuits belonging to the calibration pixel circuit group from vertical readout lines and supplies a calibration voltage to the vertical readout lines at the time when the pixel circuits belonging to the calibration pixel circuit group are read; generates imaging data having a digital value corresponding to the voltage level of the imaging signal input through the vertical readout lines and calibration data having a digital value corresponding to the voltage level of the calibration voltage; generates pixel data by applying a correction value to the imaging data while accumulating calibration data; and updates the correction value to an updated correction value generated based on a predetermined number of the calibration data pieces.

The above-described embodiment can generate highly-accurate correction values in a short time.

BRIEF DESCRIPTION OF THE DRAWINGS

FIG. 1 is a table explaining the differences in processing between an analog CDS method and a digital CDS method.

FIG. 2 illustrates the differences in readout operation between the analog CDS method and digital CDS method.

DETAILED DESCRIPTION

Figure 3:
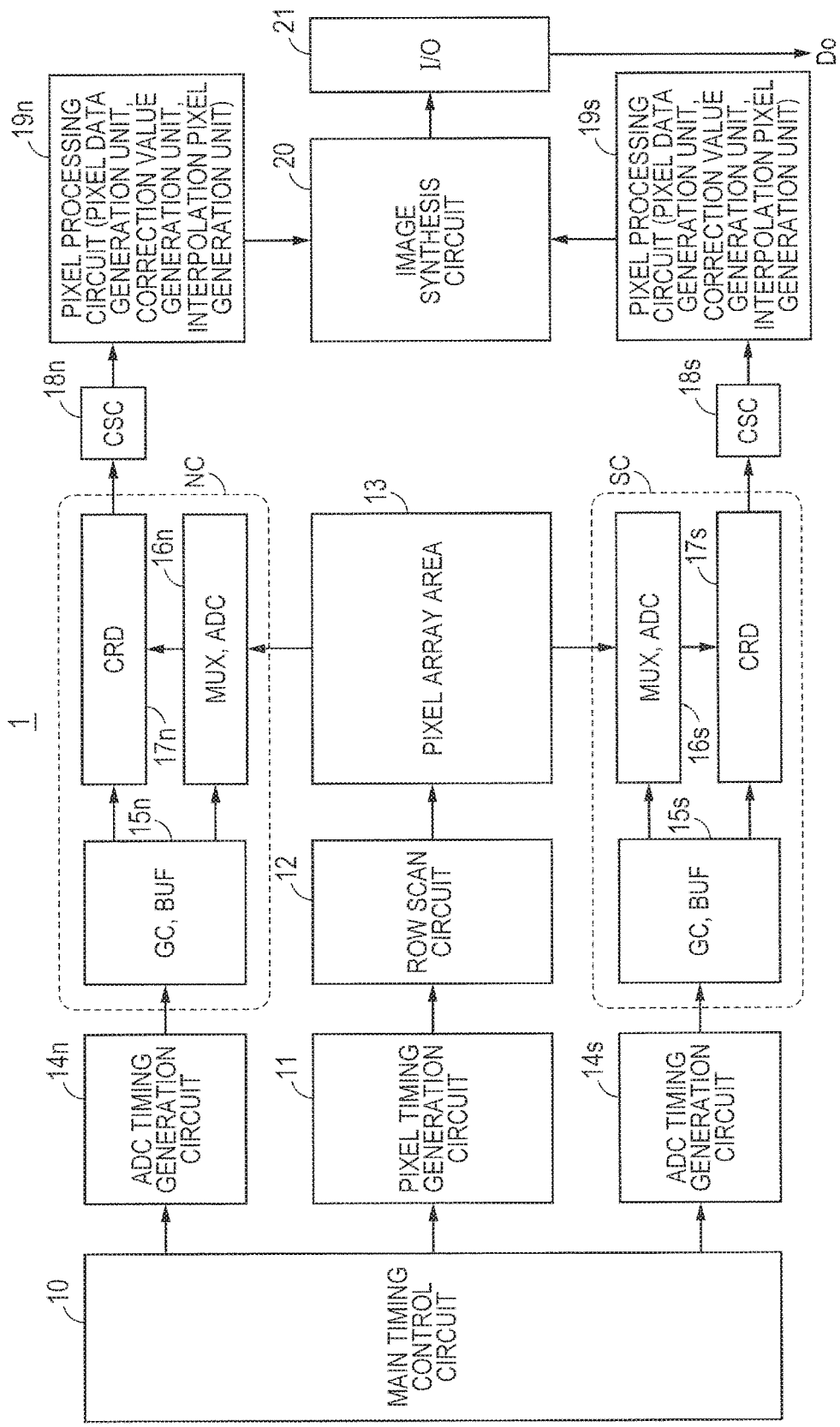
FIG. 3 is a block diagram of an image sensor according to the first embodiment.

The following descriptions and the drawings are appropriately omitted and simplified for clarifying the explanations. The components represented in the drawings as functional blocks which perform various types of processing are implemented by hardware, such as a CPU, a memory, and other forms of circuitry, or by software, such as a program loaded on a memory. Therefore, it will be obvious to those skilled in the art that the functional blocks can be implemented in a variety of manners, for example, by only hardware, by only software, or by a combination thereof, and the manners are not limited to one of them. Through all the drawings, like components are denoted by like numerals, and the explanations thereof will not be repeated on an as needed basis.

The aforementioned program can be stored in any type of non-transitory computer readable media, and provided to a computer. The non-transitory computer readable media include any type of tangible storage media. Examples of the non-transitory computer readable media include magnetic storage media (e.g., floppy disks, magnetic tapes, hard disk drives), optical magnetic storage media (e.g., magneto-optical disks), compact disc read only memory (CD-ROM), compact disc recordable (CD-R), compact disc rewritable (CD-R/W), and semiconductor memory (e.g., mask ROM, programmable ROM (PROM), erasable PROM (EPROM), flash ROM, and random access memory (RAM)). The program may be provided to a computer using any type of transitory computer readable media. Examples of the transitory computer readable media include electric signals, optical signals, and electromagnetic waves. The transitory computer readable media can provide the program to a computer via a wired communication path (e.g., electric wires, and optical fibers) or a wireless communication path.

First Embodiment

First of all, an image sensor reads out an imaging signal with a voltage level proportional to the exposure on a photoelectric conversion element (e.g., a photodiode) from a pixel circuit. In this imaging signal readout process, various elements and circuits, such as a floating diffusion, an amplifying transistor, a programmable gain amplifier, and an analog-digital converter circuit, are used to obtain imaging data having a digital value corresponding to the voltage level of the imaging signal. These elements and circuits on a transmission path of pixel signals cause a lot of errors in the imaging data. Therefore, the image sensor removes noise that is superimposed on the imaging data using a noise canceling value to obtain pixel data which is final output data.

The noise canceling value includes a correction value and a dark level value. The correction value is a value applied equally to a plurality of pixel circuits aligned in the same column among the pixel circuits arranged in a grid. The dark level value is a value applied individually to each of the pixel circuits arranged in the grid. In the following description, a readout processing mode involving noise removal using the correction value is referred to as an analog correlated double sampling (CDS) method, while a readout processing mode involving noise removal using the dark level value is referred to as a digital correlated double sampling (CDS) method. The analog CDS method and digital CDS method are different from each other in the process of generating the noise canceling value. In addition, the process of reading out an imaging signal from the pixel circuit is operated differently depending on which type of noise canceling value is used. The differences between the analog CDS method and digital CDS method will be described in detail.

FIG. 1 is a table explaining the differences in process between the analog CDS method and digital CDS method. As shown in FIG. 1, the analog CDS method and digital CDS method have differences in whether calibration operation is performed to generate the correction value, in whether an analog-digital conversion process is performed on a dark level signal (a signal with a voltage level corresponding to a reset level of a floating diffusion in the pixel circuit), and in values used for the noise removal.

More specifically, the analog CDS method performs calibration operation to generate the correction value to be used in the noise removal. The analog CDS method does not perform an analog-digital conversion process on the dark level signal because the dark level value is not used in the noise removal. In addition, the analog CDS method removes noise superimposed on an imaging signal by subtracting a correction value generated through the calibration operation from a digitized imaging signal value. On the other hand, the digital CDS method performs an analog-digital conversion process on the dark level signal every time an imaging signal is read out. Also the digital CDS method removes noise superimposed on an imaging signal by subtracting a last-generated dark level value from a digitized imaging signal value.

FIG. 2 illustrates the differences in readout operation between the analog CDS method and digital CDS method. FIG. 2 includes: a block diagram showing the flow of an image signal in the readout operation in an upper section of the drawing; a timing diagram showing the readout process of a pixel signal in the analog CDS method in a middle section of the drawing; and a timing diagram showing a readout process of a pixel signal in the digital CDS method in a lower section of the drawing.

As shown in FIG. 2, a pixel circuit includes a photoelectric conversion element (e.g., photodiode PD), a transfer transistor Tr_tx, a reset transistor Tr_rst, an amplifying transistor Tr_ami, and a selection transistor Tr_sel.

The photodiode PD has a cathode to which a ground voltage is supplied. The photodiode PD has an anode that is coupled to the source of the transfer transistor Tr_tx. A transfer control signal TX is applied to the gate of the transfer transistor Tr_tx. The drain of the transfer transistor Tr_tx is coupled to the gate of the amplifying transistor Tr_ami. The source of the reset transistor Tr_rst is coupled to the drain of the transfer transistor Tr_tx and the gate of the amplifying transistor Tr_ami. The area between the drain of the transfer transistor Tr_tx and the source of the reset transistor Tr_rst serves as a floating diffusion FD. A reset control signal RST is applied to the gate of the reset transistor Tr_rst. A pixel supply voltage VDD_PX is applied to the drain of the reset transistor Tr_rst and the drain of the amplifying transistor Tr_ami. The source of the amplifying transistor Tr_ami is coupled to the drain of the selection transistor Tr_sel. A selection signal SEL is applied to the gate of the selection transistor Tr_sel. The source of the selection transistor Tr_sel is coupled to a vertical readout line VRL.

The vertical readout line VRL is coupled to an analog-digital converter circuit (ADC in FIG. 2) at one end. The analog-digital converter circuit feeds output signals to a noise removal processing unit. The analog-digital converter circuit outputs a digital value corresponding to the voltage level of a signal input via the vertical readout line VRL. In addition, the analog-digital converter circuit receives an auto-zero control signal AZ to reset its circuit condition before conducting a conversion process. The noise removal processing unit removes the noise superimposed on imaging data using a correction value or a dark level value, and outputs pixel data Do.

Next, a description will be made about operation to read out a pixel signal Sig with the circuit shown in the block diagram in the upper section of FIG. 2. First, the operation to read out a pixel signal Sig according to the analog CDS method will be described with reference to the timing diagram of the pixel signal Sig readout process by the analog CDS method shown in the middle section of FIG. 2.

As shown in the middle section of FIG. 2, in the analog CDS method, a reset signal RST is switched from a low level to a high level at time T11 to reset the floating diffusion FD to a reset voltage. At the time T11, the selection signal SEL is also switched from a low level to a high level. At time T12, the analog-digital converter circuit is reset in response to an auto-zero control signal AZ. Subsequently, at time T13, the transfer control signal TX is switched from a low level to a high level. This makes the transfer transistor Tr_tx conductive, and the charge accumulated in the photodiode PD is read out to the floating diffusion FD. Then, the pixel circuit outputs a pixel signal Sig based on the voltage level of the floating diffusion FD. The image sensor performs analog-digital conversion processing on the imaging signal Sig.

Second, the operation to read out a pixel signal Sig according to the digital CDS method will be described with reference to the timing diagram of the pixel signal Sig readout process by the digital CDS method shown in the lower section of FIG. 2.

As shown in the lower section of FIG. 2, in the digital CDS method, a reset signal RST is switched from a low level to a high level at time T21 to reset the floating diffusion FD to a reset voltage. At time T21, a selection signal SEL is switched from a low level to a high level. At time T22, the analog-digital converter circuit is reset in response to an auto-zero control signal AZ. Subsequently, an analog-digital conversion process to a dark level signal Dark is started at time T23 at which the auto-zero processing is completed. This dark level signal is output from the pixel circuit based on the reset voltage applied to the floating diffusion FD. Then, the transfer control signal TX is switched from a low level to a high level at time T24. This makes the transfer transistor Tr_tx conductive, and the charge accumulated in the photodiode PD is read out to the floating diffusion FD. Then, the pixel circuit outputs a pixel signal Sig based on the voltage level of the floating diffusion FD. The image sensor performs analog-digital conversion processing on the imaging signal Sig.

The image sensor 1 according to the first embodiment performs a noise removal process according to the analog CDS method. As described above, the analog CDS method does not require to perform analog-digital conversion processing on the dark level signal Dark, which serves as a noise canceling value, for every pixel circuit, and therefore is able to shorten the time required to read out an imaging signal from a pixel circuit in comparison with the digital CDS method. In recent years, the number of pixels to form an image tends to increase. For moving images, there is a trend toward a high frame rate. In keeping with the trends, shortening the time required to read out an imaging signal from a pixel circuit is a significant issue, and therefore the noise removal processing according to the analog CDS method brings about significant advantages.

On the other hand, since the analog CDS method uses a correction value to pixel circuits aligned in the same column, an error between the correction value and a noise component generated on the path through which a pixel signal is read out increases, thereby producing fixed pattern noise that causes stripe noise fixedly appearing in the image. To prevent the fixed pattern noise, it is necessary to increase the accuracy of the correction value to reduce the error with the noise component generated on the pixel signal readout path. One of the methods for improving the correction value accuracy is to use more calibration data to generate the correction value. The calibration data is, for example, pixel data output by the analog-digital converter circuit while the vertical readout line VRL is set to a dark level.

The image sensor 1 according to the first embodiment adopts a configuration and calibration operation to acquire necessary calibration data in a shorter time in order to sufficiently improve the accuracy of a correction value. The configuration and calibration operation of the image sensor 1 according to the first embodiment will be described below in detail.

The description below designates imaging signals with a reference sign Sig, calibration voltages with VCAL, imaging data with Dsig, calibration data with Dsig, pixel data with Dpc, interpolation pixel data with Dpx_LIC, and correction values with CV; however, the reference signs are sometimes omitted in the drawings.

FIG. 3 is a block diagram of the image sensor 1 according to the first embodiment. The block diagram shown in FIG. 3 has been prepared to focus on essential parts associated with the operation of the image sensor 1 according to the first embodiment, but can include other circuit blocks.

As shown in FIG. 3, the image sensor 1 according to the first embodiment includes a main timing control circuit 10, a pixel timing generation circuit 11, a row scan circuit 12, a pixel array area 13, an ADC timing generation circuit 14, conversion-process sequential circuits 15s, 15n, analog-digital converter circuit groups 16s, 16n, horizontal transfer circuits 17s, 17n, column selection circuits 18s, 18n, pixel processing circuits 19s, 19n, an image synthesis circuit 20, and an input-output interface circuit 21. The conversion-process sequential circuit 15s, analog-digital converter circuit group 16s, and horizontal transfer circuit 17s make up a south column processing circuit SC, while the conversion-process sequential circuit 15n, analog-digital converter circuit group 16n, and horizontal transfer circuit 17n make up a north column processing circuit NC.

In the image sensor 1 according to the first embodiment, a grid of a plurality of pixel circuits are arranged in the pixel array area 13. The image sensor 1 according to the first embodiment processes imaging signals Sig, which are output from pixel circuits arranged in either one of an odd number column group and an even number column group, and imaging signals Sig, which are output from pixel circuits arranged in the other column group, at the processing circuit groups arranged on the upper and lower sides of the pixel array area 13. In FIG. 3, the circuits in a group arranged on a lower side of the pixel array area 13 have reference numerals ending in "s", while the circuits in a group arranged on an upper side of the pixel array area 13 have reference numerals ending in "n". This means that the circuit blocks with reference numerals ending "s" and "n" have the same configuration and operate in the same manner. Therefore, the circuit blocks will be described without mentioning the letter "s" or "n".

The main timing control circuit 10 outputs a sequence control signal, which controls the sequence of operations of the entire image sensor 1 according to the first embodiment, to the pixel timing generation circuit 11 and the ADC timing generation circuit 14. The pixel timing generation circuit 11 generates a pixel timing signal based on the sequence control signal. The pixel timing signal controls the sequence of operations of the pixel circuits arranged in the pixel array area 13. The row scan circuit 12 generates specific control signals and feeds the signals to the circuits or elements in the pixel array area 13 based on the pixel timing signal. The pixel array area 13 contains a grid of multiple pixel circuits arranged in columns and rows. The pixel array area 13 also contains vertical readout lines, each of which is assigned to a column of the pixel circuits. Thus, the pixel circuits are coupled to the assigned vertical readout lines. In addition, a pixel clamping circuit and a pixel current source are coupled to each of the vertical readout lines in the pixel array area 13.

The ADC timing generation circuit 14 outputs a column control signal that controls the sequence of operations of the circuit group, which includes the analog-digital converter circuits and performs conversion processing, based on the sequence control signal. The column control signal includes a plurality of signals. One of the signals is a ramp voltage Vramp whose voltage value changes with time so as to make a ramp waveform.

The conversion-process sequential circuit 15 includes a global counter GC and a buffer circuit BUF. The global counter GC generates a global count value that increments with changes in the ramp voltage Vramp. The conversion-process sequential circuit 15 controls the operation of shift resistors in the horizontal transfer circuit 17 with the global count values. The buffer circuit BUF amplifies the ramp voltage Vramp fed from the ADC timing generation circuit 14, and feeds the amplified voltage to the analog-digital converter circuit in the analog-digital converter circuit group 16.

The analog-digital converter circuit group 16 includes a plurality of multiplexers MUX and a plurality of analog-digital converter circuits ADC, each of which accepts signals input through the associated vertical readout line independently on a column-by-column basis, and processes the input signals. The horizontal transfer circuit 17 reads data from each column output by the analog-digital converter circuits ADC on a column-by-column basis, and transfers the data to the subsequent column selection circuit 18. Then, the column selection circuit 18 reads out the data output by the analog-digital converter circuit ADC via the horizontal transfer circuit 17 in column order, and feeds the data to the subsequent pixel processing circuit 19.

The pixel processing circuit 19 performs noise removal processing and other processing on the data, which has been converted into a digital value by the analog-digital converter circuit group 16, to generate pixel data, and outputs the pixel data to the image synthesis circuit 20. The detailed description about the processing and circuit blocks in the pixel processing circuit 19 will be described later. The image synthesis circuit 20 synthesizes the pixel data pieces input from the pixel processing circuit 19s and pixel processing circuit 19n to generate a piece of image data Do for every frame. The input-output interface circuit 21 outputs the image data Do generated by the image synthesis circuit 20 to an external circuit or an external device.

The image sensor 1 according to the first embodiment performs normal operation and calibration operation in a switchable manner. In normal operation, the image sensor 1 according to the first embodiment reads out imaging signals Sig from the pixel circuits arranged in a grid. Each of the imaging signals Sig has a voltage level proportional to the exposure on the photoelectric conversion element (e.g., photodiodes) in the pixel circuit. In calibration operation, the image sensor 1 according to the first embodiment generates a correction value to be applied equally to the imaging signals Sig that are output from the pixel circuits aligned in the same rows. Especially, in calibration operation, iteratively performing the process to read out the imaging signals Sig from the pixel circuits and the process to read out the calibration voltages VCAL to be used to calculate the correction value at predetermined time intervals increases the number of times in which the calibration voltage VCAL is read out within a period in which pixel signals of one frame are read out. To accomplish such calibration operation, the image sensor 1 according to the first embodiment has one of features in the circuit configuration and operation on the path from the pixel circuits to the pixel processing circuit 19. The feature will become apparent by specifically describing the pixel array area 13, analog-digital converter circuit group 16, horizontal transfer circuit 17, and pixel processing circuit 19.

Figure 4:
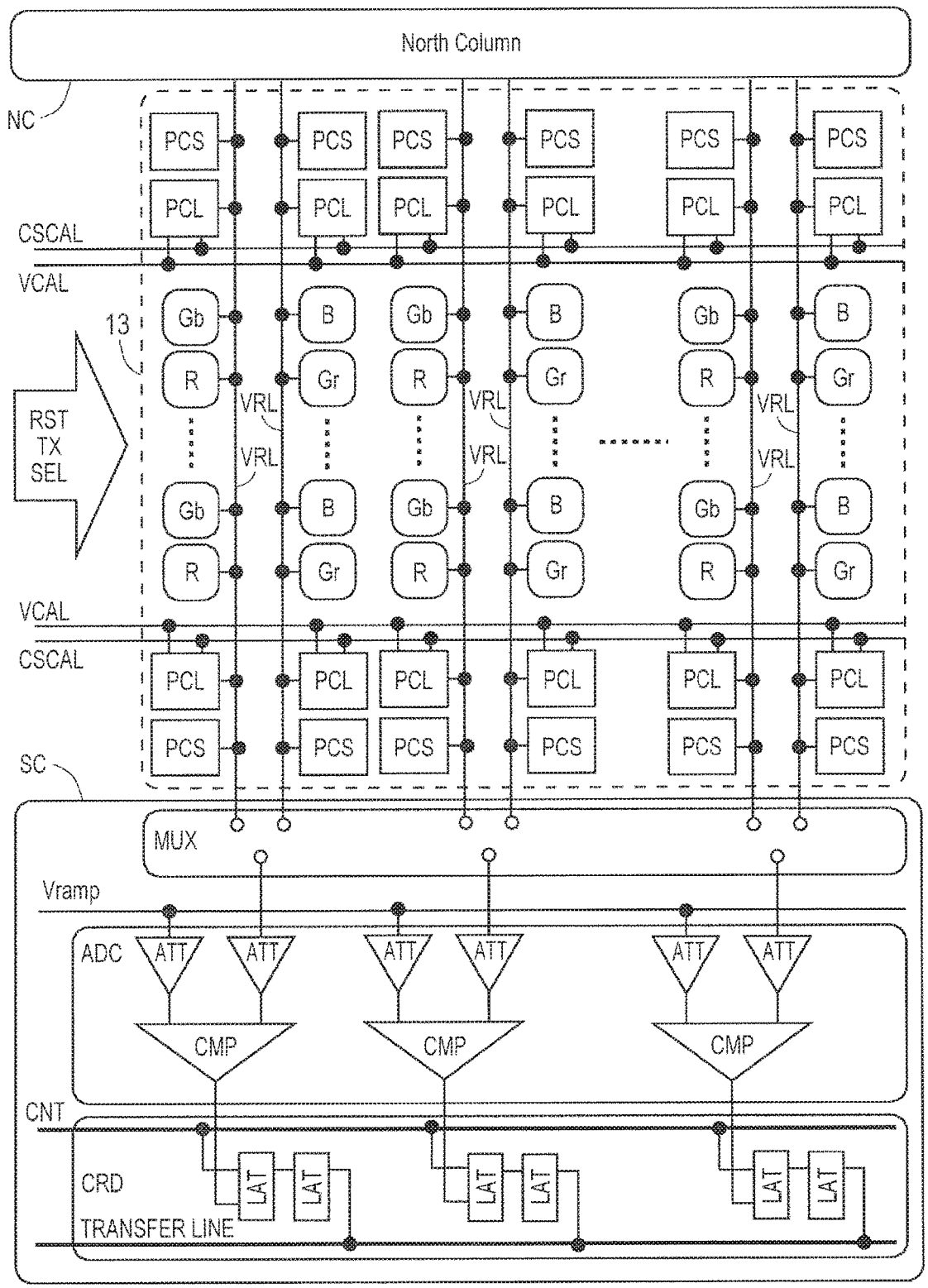
FIG. 4 is a block diagram of a pixel array area and a column processing circuit of the image sensor according to the first embodiment.

FIG. 4 is a block diagram of the pixel array area and column processing circuit of the image sensor according to the first embodiment. As shown in FIG. 4, the column processing circuit includes the analog-digital converter circuit group 16 (MUX and ADC in FIG. 4) and the horizontal transfer circuit 17 (CRD in FIG. 4).

As shown in FIG. 4, the pixel array area 13 holds a plurality of pixel circuits arranged in a grid. The pixel circuits have color filters, a red (R), blue (B), or green (Gb, Gr) filter, and are arranged in a pattern, so called Bayer arrangement. In the example shown in FIG. 4, the pixel circuits are indicated by letters representing the color of the associated color filter. The pixel array area 13 is provided with a plurality of vertical readout lines VRL. Each of the vertical readout lines VRL is coupled to a plurality of pixel circuits that are aligned in the same column.

The pixel array area 13 is also provided with pixel current sources PCS and pixel clamping circuits PCL. The pixel current sources PCS are arranged near the opposite ends of the vertical readout lines VRL and also arranged near the column processing circuits. The pixel current sources PCS supply a load current to the amplifying transistors in the pixel circuits via the vertical readout lines VRL. The pixel clamping circuits PCL apply a calibration voltage VCAL to the vertical readout lines VRL. The pixel clamping circuits PCL are arranged near the opposite ends of the vertical readout lines VRL and also arranged near the column processing circuits.

A calibration voltage VCAL and a calibration notification signal CSCAL are input to the pixel current sources PCS. In the image sensor 1 according to the first embodiment, the pixel timing generation circuit 11 and row scan circuit 12 make up a timing generator. The calibration voltage VCAL and calibration notification signal CSCAL are generated by a circuit in the row scan circuit 12. The pixel current sources PCS supply the calibration voltage VCAL to the vertical readout lines VRL while the calibration notification signal CSCAL is enabled (e.g., high level). The calibration voltage VCAL has a voltage assumed to correspond to a signal level of, for example, a dark level signal.

Since the south column processing circuit SC and the north column processing circuit NC have the same circuit configuration, FIG. 4 shows a detailed block diagram of only the south column processing circuit SC. As shown in FIG. 4, the south column processing circuit SC includes multiplexers MUX, analog-digital converter circuits ADC, and horizontal transfer circuit CRD.

The multiplexers MUX include selection circuits, each of which is provided for two vertical readout lines VRL. When the multiplexers MUX in the south column processing circuit SC select one of a group of odd number columns and a group of even number columns, multiplexers MUX in the north column processing circuit NC select the other group.

Analog-digital converter circuits are provided for the selection circuits on a one-to-one basis. In the example shown in FIG. 4, each of the analog-digital converter circuits includes an amplifier ATT that amplifies a ramp signal Vramp, an amplifier ATT that amplifies a signal input from a vertical readout line VRL via the selection circuit, and a comparator CMP that switches an output signal between a high level and a low level in accordance with the magnitude relation between the signals output from the two amplifiers ATT. Changing the gain of the two amplifiers ATT changes the gain of the analog-digital converter circuits ADC.

When the image sensor 1 according to the first embodiment reads out an imaging signal Sig from a pixel circuit, the imaging signal Sig is input to an analog-digital converter circuit ADC via a vertical readout line VRL. On the other hand, when the image sensor 1 according to the first embodiment performs calibration operation, a calibration voltage VCAL is input into an analog-digital converter circuit ADC via a vertical readout line VRL. In other words, the analog-digital converter circuit ADC of the image sensor 1 according to the first embodiment generates imaging data Dsig having a digital value corresponding to the voltage level of the imaging signal Sig input via the associated vertical readout line VRL and also generates calibration data DCAL having a digital value corresponding to the voltage level of the calibration voltage VCAL.

The horizontal transfer circuit CRD includes shift registers each made up with a plurality of latch circuits LAT and provided for every analog-digital converter circuit ADC. The outputs of the shift registers in the horizontal transfer circuit CRD are coupled to a transfer line. The values in the shift registers are transferred to the subsequent pixel processing circuit 19 through the transfer line. The column selection circuit 18 selects data to be transferred to the pixel processing circuit 19 via the transfer line. In addition, the shift registers successively shift the values output from the analog-digital converter circuits ADC in response to the count value of the global count value CNT to the subsequent latch circuits.

Figure 5:
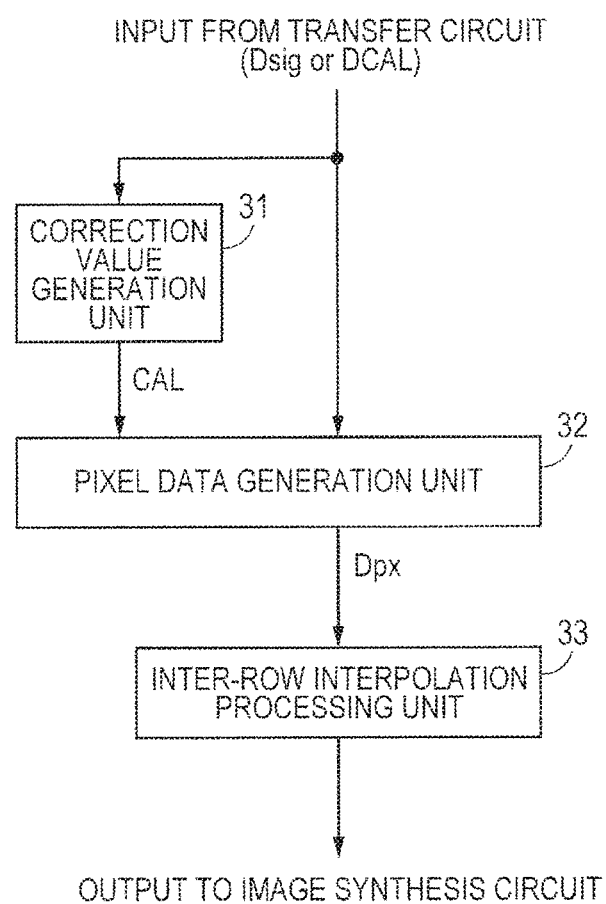
FIG. 5 is a block diagram of a pixel processing circuit of the image sensor according to the first embodiment.

Next, the pixel processing circuit 19 will be described in detail. FIG. 5 is a block diagram of the pixel processing circuit 19 of the image sensor according to the first embodiment. As shown in FIG. 5, the pixel processing circuit 19 includes a correction value generation unit 31, a pixel data generation unit 32, and an inter-row interpolation processing unit 33.

The correction value generation unit 31 accumulates calibration data pieces DCAL to generate an updated correction value based on a predetermined number of the accumulated calibration data pieces DCAL, and updates a correction value CV to the updated correction value. The pixel data generation unit 32 generates pixel data Dpx by applying a correction value CV to the imaging data Dsig. The inter-row interpolation processing unit 33 generates interpolation pixel data Dsig_LIC by interpolation, and assigns the interpolation pixel data Dpx_LIC as pixel data Dpx that cannot be acquired from a row because calibration data DCAL is acquired therefrom. More detailed description about the correction value generation unit 31, pixel data generation unit 32, and inter-row interpolation processing unit 33 will be given below.

Figure 6:
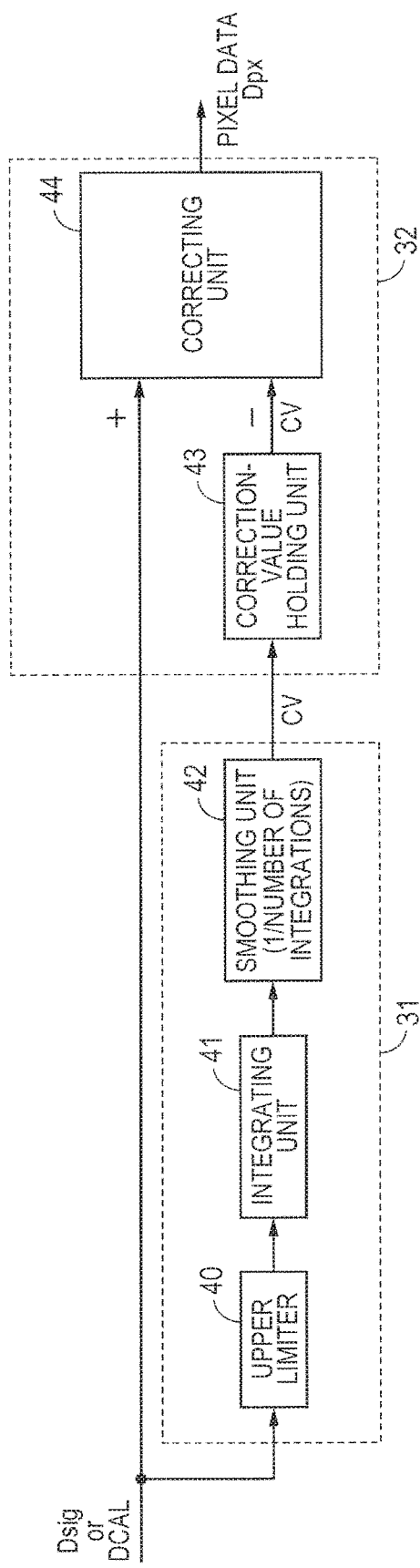
FIG. 6 is a block diagram of a correction value generation unit and a pixel data generation unit of the image sensor according to the first embodiment.

FIG. 6 is a block diagram of the correction value generation unit 31 and pixel data generation unit 32 of the image sensor according to the first embodiment. As shown in FIG. 6, the correction value generation unit 31 includes an upper limiter 40, an integrating unit 41, and a smoothing unit 42. The upper limiter 40 limits the number of bits of the calibration data DCAL to a predetermined number of bits to take a load off the subsequent circuits. The integrating unit 41 adds up the calibration data pieces, which have been subjected to the process by the upper limiter 40, to obtain an integrated value. The smoothing unit 42 smooths the integrated calibration data by dividing the integrated value by the number of the integrated calibration data pieces. The calibration data DCAL that has been smoothed by the smoothing unit 42 is used as an updated correction value. The smoothing unit 42 updates the correction value CV held in a correction-value holding unit 43 in the pixel data generation unit 32 to the updated correction value. The smoothing process can reduce noise components that are superimposed on the calibration data DCAL during the acquisition of the calibration data DCAL.

The pixel data generation unit 32 includes a correction-value holding unit 43 and a correcting unit 44. The correcting unit 44 generates pixel data Dpx by subtracting a correction value held in the correction-value holding unit 43 from imaging data Dsig.

Next, the inter-row interpolation processing unit 33 will be described in detail. In normal operation, the inter-row interpolation processing unit 33 receives pixel data Dpx, and outputs the pixel data Dpx as it is. In calibration operation, on the other hand, the inter-row interpolation processing unit 33 generates interpolation pixel data Dpx_LIC that corresponds to imaging data Dsig of a pixel circuit on which processing of reading out the imaging data Dsig was not performed to acquire calibration data DCAL, and outputs the generated interpolation pixel data Dpx_LIC as the imaging data Dsig that could not have been read out.

Figure 7:
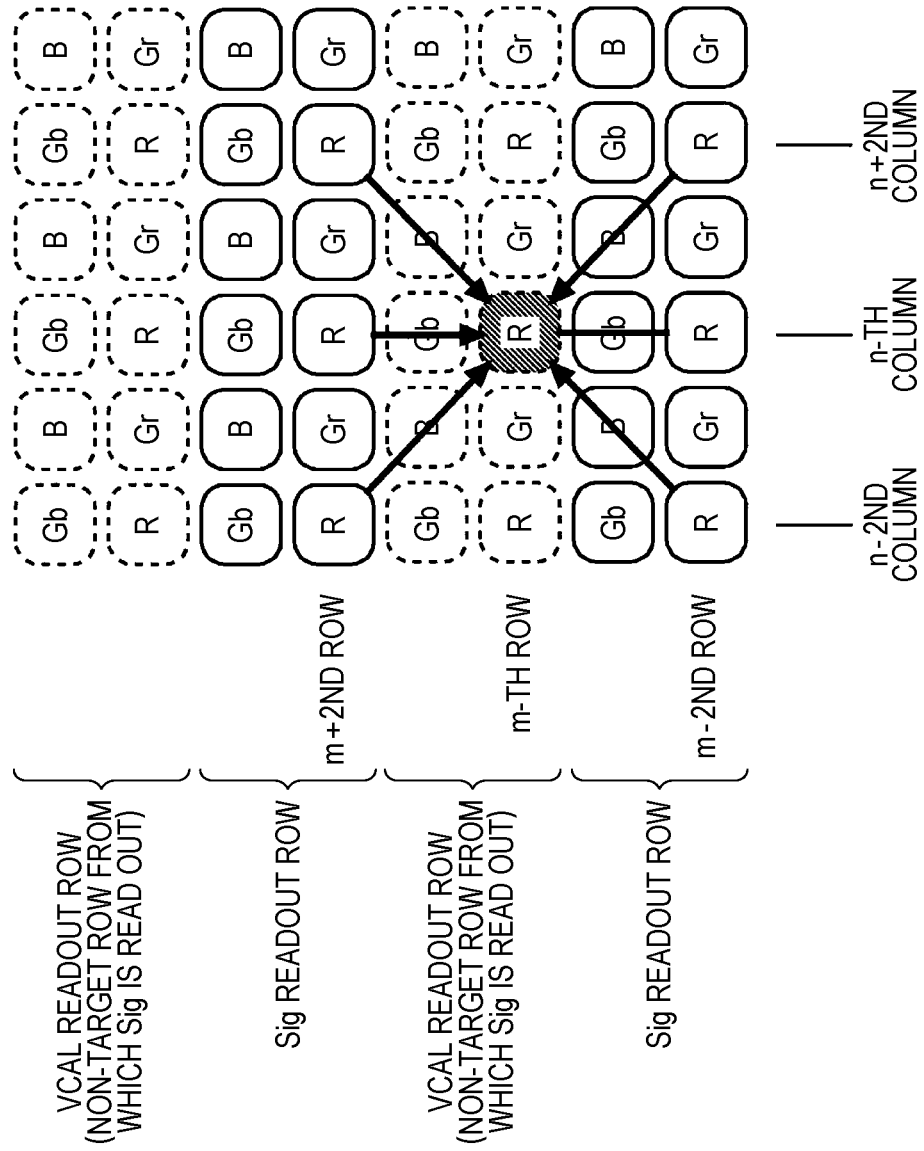
FIG. 7 illustrates pixel data to be used to generate interpolation pixel data in the image sensor according to the first embodiment.

To be more concrete, a description will be made about how the inter-row interpolation processing unit 33 generates the interpolation pixel data Dpx_LIC. FIG. 7 illustrates pixel data to be used to generate the interpolation pixel data in the image sensor according to the first embodiment. In FIG. 7, m denotes a row number, while n denotes a column number. The method of generating the interpolation pixel data shown in FIG. 7 is merely an example, and the number of pixel data pieces used to generate the interpolation pixel data varies depending on the interpolation pixel data generation method adopted.

FIG. 7 shows pixel circuits in target rows from which imaging signals Sig are read out, and pixel circuits in target rows from which calibration voltages VCAL are read out during calibration operation. In calibration operation, as shown in FIG. 7, the image sensor 1 according to the first embodiment divides rows into groups having the same combination of color filters, and selects one of two neighboring groups as the target rows from which imaging signals Sig are read out, while selecting the other group as the target rows from which calibration voltages VCAL are read out.

More specifically, the timing generator (e.g., the pixel timing generation circuit 11 and row scan circuit 12) in the image sensor 1 according to the first embodiment categorizes the pixel circuits by row into an imaging pixel circuit group (Sig readout rows in FIG. 7) and a calibration pixel circuit group (VCAL readout rows in FIG. 7), in the calibration operation. Then, the timing generator instructs the pixel circuits belonging to the imaging pixel circuit group to output imaging signals even during calibration operation. On the other hand, at the time when readout operation is performed on the pixel circuits belonging to the calibration pixel circuit group, the timing generator electrically cuts off the pixel circuits belonging to the calibration pixel circuit group from the vertical readout lines, and also supplies a calibration voltage VCAL from pixel clipping circuits PCL to the vertical readout lines. In the example shown in FIG. 7, the image sensor 1 according to the first embodiment includes color filters arranged in the same color pattern for every two rows. Therefore, the image sensor 1 according to the first embodiment pairs up contiguous rows and categorizes the pairs of rows into one of the imaging pixel circuit group and calibration pixel circuit group, and defines the pairs of rows belonging to the imaging pixel circuit group and calibration pixel circuit group to be alternately arranged.

According to the definition, each of the row pairs categorized into the imaging pixel circuit group or calibration pixel circuit group in the image sensor 1 according to the first embodiment includes at least two pixel circuits that are arranged in the same column and in the contiguous rows. The imaging pixel circuit group and calibration pixel circuit group are alternately arranged. Furthermore, the color filter pattern of the pixel circuits belonging to the imaging pixel circuit group is identical to the color filter pattern of the pixel circuits belonging to the calibration pixel circuit group.

The inter-row interpolation processing unit 33 generates interpolation pixel data associated with a pixel circuit by using pixel data of six pixel circuits. The six pixel circuits belong to the imaging pixel circuit group, have color filters of the same color as the color filter of the pixel circuit associated with the interpolation pixel data, and are chosen in the order of proximity to the pixel circuit associated with the interpolation pixel data. In the example shown in FIG. 7, six pixel data pieces Dpx of the pixel circuits at the m+2nd row and the n−2nd column, at the m+2nd row and the nth column, at the m+2nd row and n+2nd column, at the m−2nd row and the n−2nd column, at the m−2nd row and nth column, and at the m−2nd row and n+2nd column are used to generate interpolation pixel data Dpx_LIC of the pixel circuit having a red filter at the mth row and nth column.

Although a detailed description will be made later, the inter-row interpolation processing unit 33 applies a weighting factor to the pixel data to be used to generate the interpolation pixel data Dpx_LIC. The farther the pixel circuits whose pixel data is used to generate the interpolation pixel data Dpx_LIC are from the pixel circuit belonging to the calibration pixel circuit group, the smaller the weighting factor is. In the example shown in FIG. 7, the pixel circuits at the m+2nd row and the nth column and at the m−2nd row and the nth column are closer to the pixel circuit associated with the interpolation pixel data Dpx_LIC than the other pixel circuits. Therefore, a weighting factor of 2 is applied to the pixel data Dpx output from the pixel circuits at the m+2nd row and the nth column and at the m−2nd row and the nth column. On the other hand, the pixel circuits at the m+2nd row and the n−2nd column, at the m+2nd row and the n+2nd column, at the m−2nd row and the n−2nd column, and at the m−2nd row and the n+2nd column are farther from the pixel circuit associated with the interpolation pixel data Dpx_LIC than the pixel circuits at the m+2nd row and the nth column and at the m−2nd row and the nth column. Therefore, a weighting factor of 1 is applied to the pixel data Dpx output from the pixel circuits at the m+2nd row and the n−2nd column, at the m+2nd row and the n+2nd column, at the m−2nd row and the n−2nd column, and at the m−2nd row and the n+2nd column.

Figure 8:
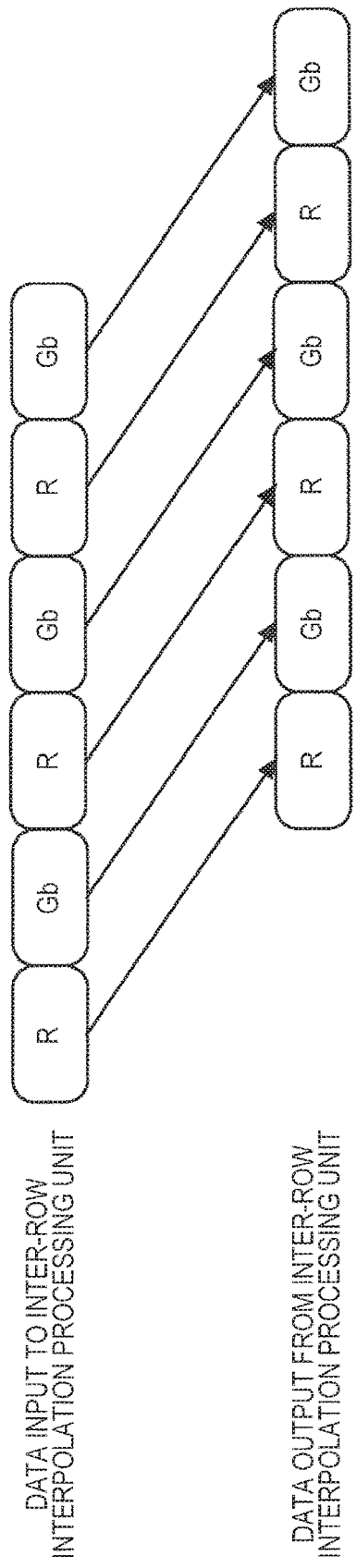
FIG. 8 is a timing diagram explaining the operation of an inter-row interpolation processing unit, during normal operation, of the image sensor according to the first embodiment.

Next, a description will be given about the time at which data is input to or output from the inter-row interpolation processing unit 33. FIG. 8 is a timing diagram explaining the operation of the inter-row interpolation processing unit, during normal operation, of the image sensor according to the first embodiment. In normal operation, as shown in FIG. 8, after having accepted two pixel data pieces, the inter-row interpolation processing unit 33 starts outputting data in chronological order in which the data is input.

Figure 9:
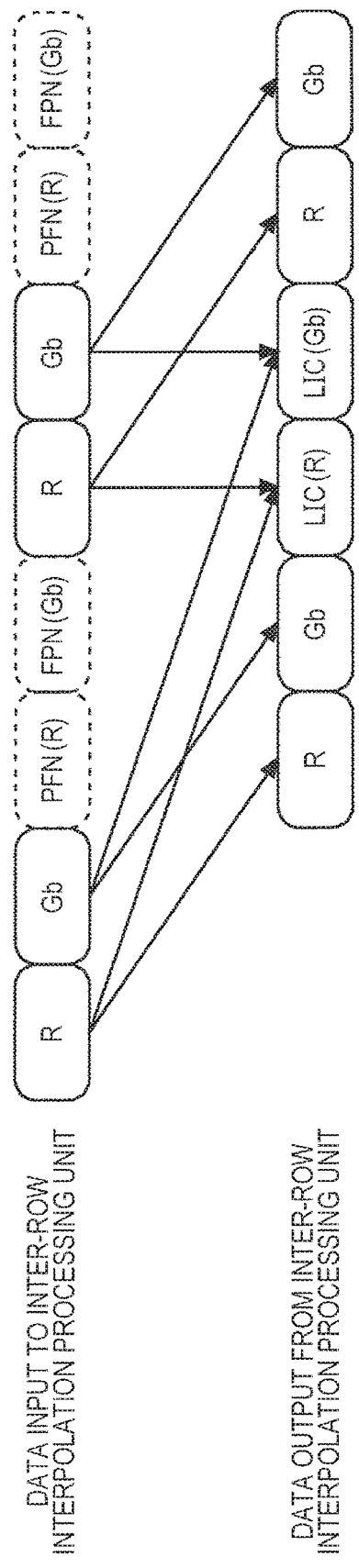
FIG. 9 is a timing diagram explaining the operation of the inter-row interpolation processing unit, during calibration operation, of the image sensor according to the first embodiment.

FIG. 9 is a timing diagram explaining the operation of the inter-row interpolation processing unit 33, during calibration operation, of the image sensor according to the first embodiment. In even calibration operation, as shown in FIG. 9, the inter-row interpolation processing unit 33 starts outputting data in chronological order in which the data is input after having accepted two pixel data pieces. However, in the calibration operation, the inter-row interpolation processing unit 33 does not receive pixel data Dpx from the pixel circuits in the rows from which calibration data DCAL is acquired. Thus, the inter-row interpolation processing unit 33 generates interpolation pixel data Dpx_LIC (LIC in FIG. 9) in a period in which the pixel data Dpx is not input, and outputs the interpolation pixel data Dpx_LIC at the time when the pixel data Dpx is missing.

Figure 10:
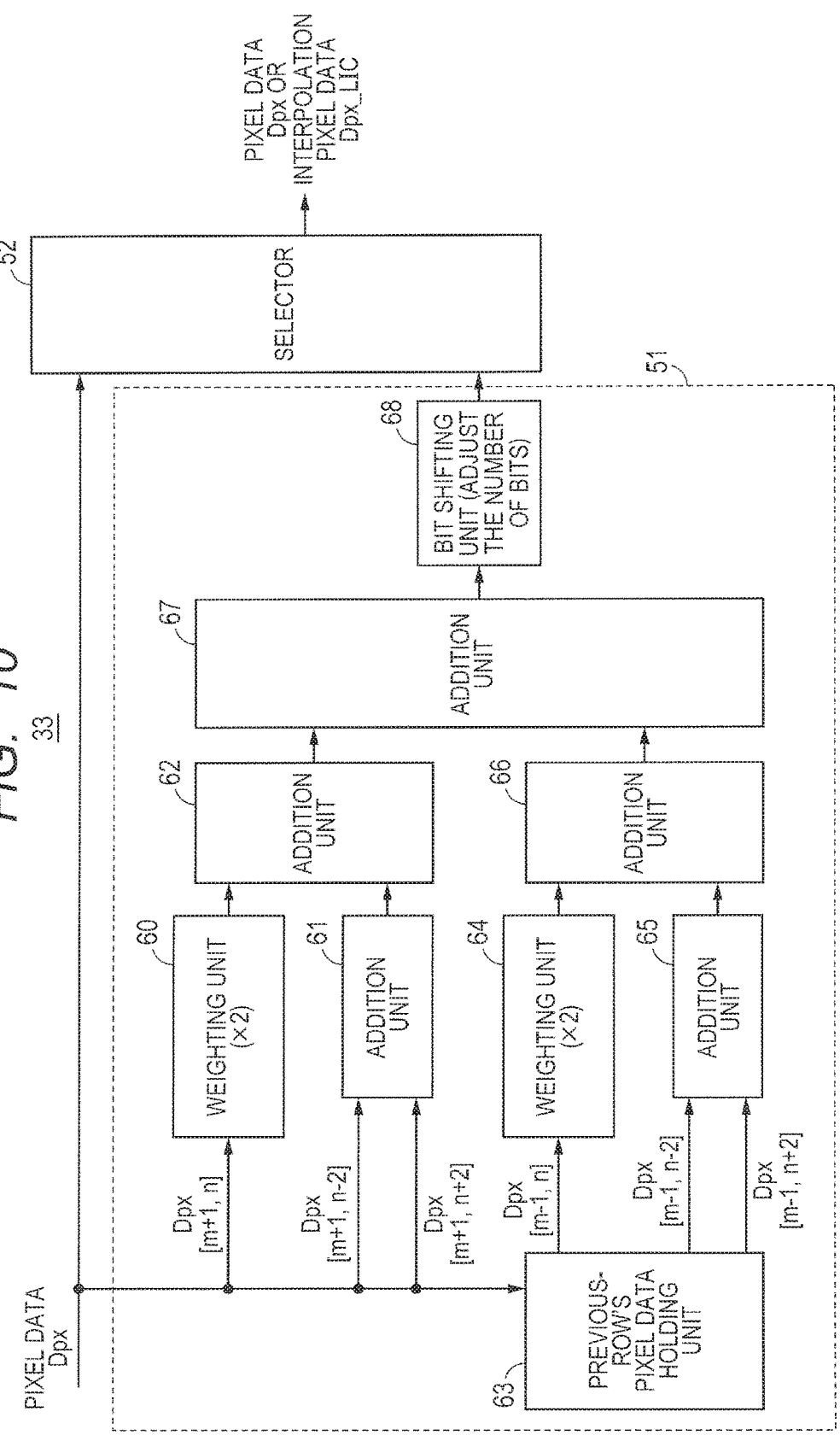
FIG. 10 is a block diagram of the inter-row interpolation processing unit of the image sensor according to the first embodiment.

Next, the circuit configuration of the inter-row interpolation processing unit 33 will be described. FIG. 10 is a block diagram of the inter-row interpolation processing unit in the image sensor according to the first embodiment. As shown in FIG. 10, the inter-row interpolation processing unit 33 includes an interpolation data generation unit 51 and a selector 52. The interpolation data generation unit 51 generates pixel data associated with a pixel circuit belonging to the calibration pixel circuit group (e.g., VCAL readout rows in FIG. 7) by synthesizing pixel data associated with pixel circuits that belong to the imaging pixel circuit group (e.g., Sig readout rows in FIG. 7) and are arranged around th pixel circuit belonging to the calibration pixel circuit group, and outputs the generated pixel data as interpolation pixel data Dpx_LIC. The selector 52 outputs pixel data Dpx in synchronization with the timing at which the pixel circuits belonging to the imaging pixel circuit group output data, while outputting interpolation pixel data Dpx_LIC in synchronization with the timing at which the pixel circuits belonging to the calibration pixel circuit group output data.

The interpolation data generation unit 51 includes a weighting unit 60, an addition unit 61, an addition unit 62, a previous-row's pixel data holding unit 63, a weighting unit 64, an addition unit 65, an addition unit 66, an addition unit 67, and a bit shifting unit 68. This interpolation data generation unit 51 generates interpolation pixel data Dpx_LIC for the pixel circuit at the mth row and the nth column.

The weighting unit 60 multiplies the pixel data Dpx at the m+2nd row and the nth column by a weighting factor of 2. The addition unit 61 adds the pixel data Dpx at the m+2nd row and the n−2nd column to the pixel data Dpx at the m+2nd row and n+2nd column. The previous-row's pixel data holding unit 63 retains pixel data Dpx output from the imaging pixel circuit group that has been read out before the calibration pixel circuit group including the pixel circuit for which interpolation pixel data Dpx_LIC is to be generated. The weighting unit 64 multiplies pixel data Dpx of the pixel circuit at the m−2nd row and the nth column by a weighting factor of 2. The addition unit 65 adds the pixel data Dpx at the m−2nd row and the n−2nd column to the pixel data Dpx at the m−2nd row and the n+2nd column.

The addition unit 62 adds a first intermediate pixel data generated by the weighting unit 60 to a second intermediate pixel data generated by the addition unit 61 to generate a third intermediate pixel data. The addition unit 66 adds a fourth intermediate pixel data generated by the weighting unit 64 to a fifth intermediate pixel data generated by the addition unit 65 to generate a sixth intermediate pixel data. The addition unit 67 adds the third intermediate pixel data to the sixth intermediate pixel data to generate a seventh intermediate pixel data.

Since the seventh intermediate pixel data is generated by adding a plurality of pixel data pieces, the number of bits of the seventh intermediate pixel data is large in comparison with pixel data Dpx. Thus, the bit shifting unit 68 performs a bit shift process to make the number of bits of the seventh intermediate pixel data the same as the number of bits of the pixel data Dpx, thereby generating the interpolation pixel data Dpx_LIC.

Figure 11:
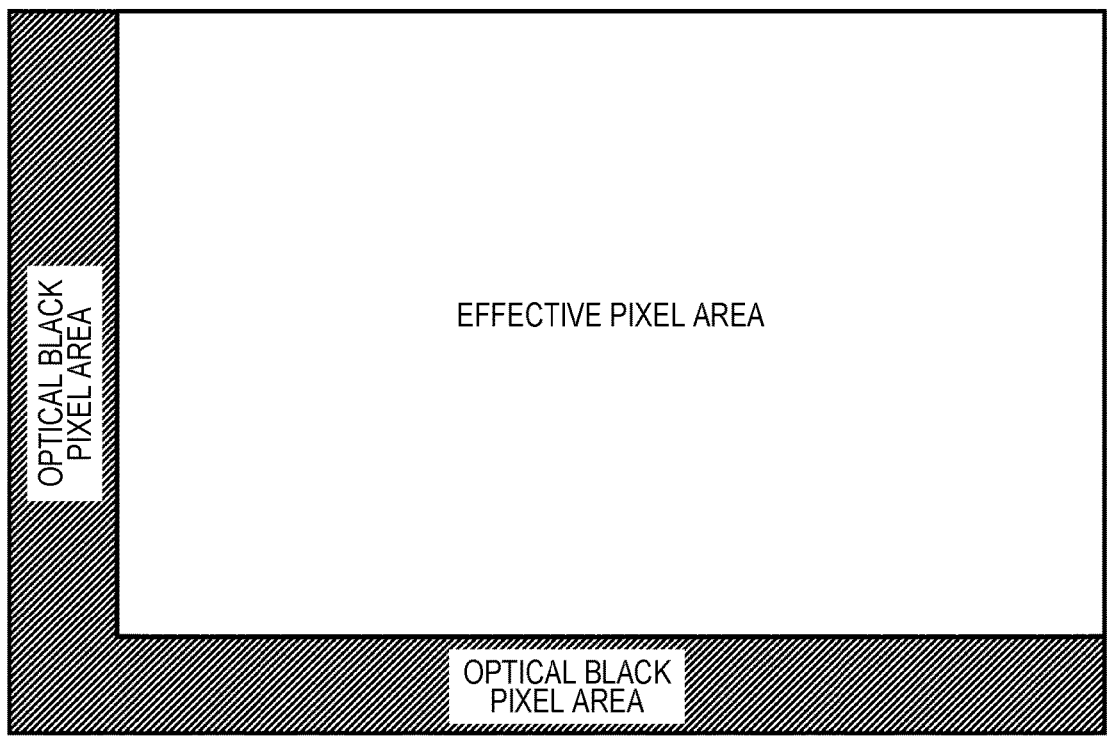
FIG. 11 illustrates an effective pixel area and an optical black pixel area of the image sensor according to the first embodiment.

Next, the operation of the image sensor 1 according to the first embodiment will be described. First, the pixel circuits arranged in the pixel array area 13 will be described. FIG. 11 illustrates an effective pixel area and an optical black pixel area of the image sensor according to the first embodiment. The pixel array area 13 includes pixel circuits arranged in the effective pixel area on which incident light impinges through lenses, and pixel circuits arranged in the optical black pixel area (OB pixels) where incident light is blocked. The optical black pixel area extends along two sides of the outer periphery of the effective pixel area. In normal operation, the image sensor 1 according to the first embodiment obtains calibration data DCAL using the pixel circuits arranged in the optical black pixel area, and also obtains imaging data Dsig from the pixel circuits arranged in the effective pixel area. In calibration, on the other hand, the image sensor 1 according to the first embodiment obtains calibration data DCAL using the pixel circuits arranged in the optical black pixel area and the effective pixel area, and also obtains imaging data Dsig from the pixel circuits arranged in the effective pixel area.

Figure 12:
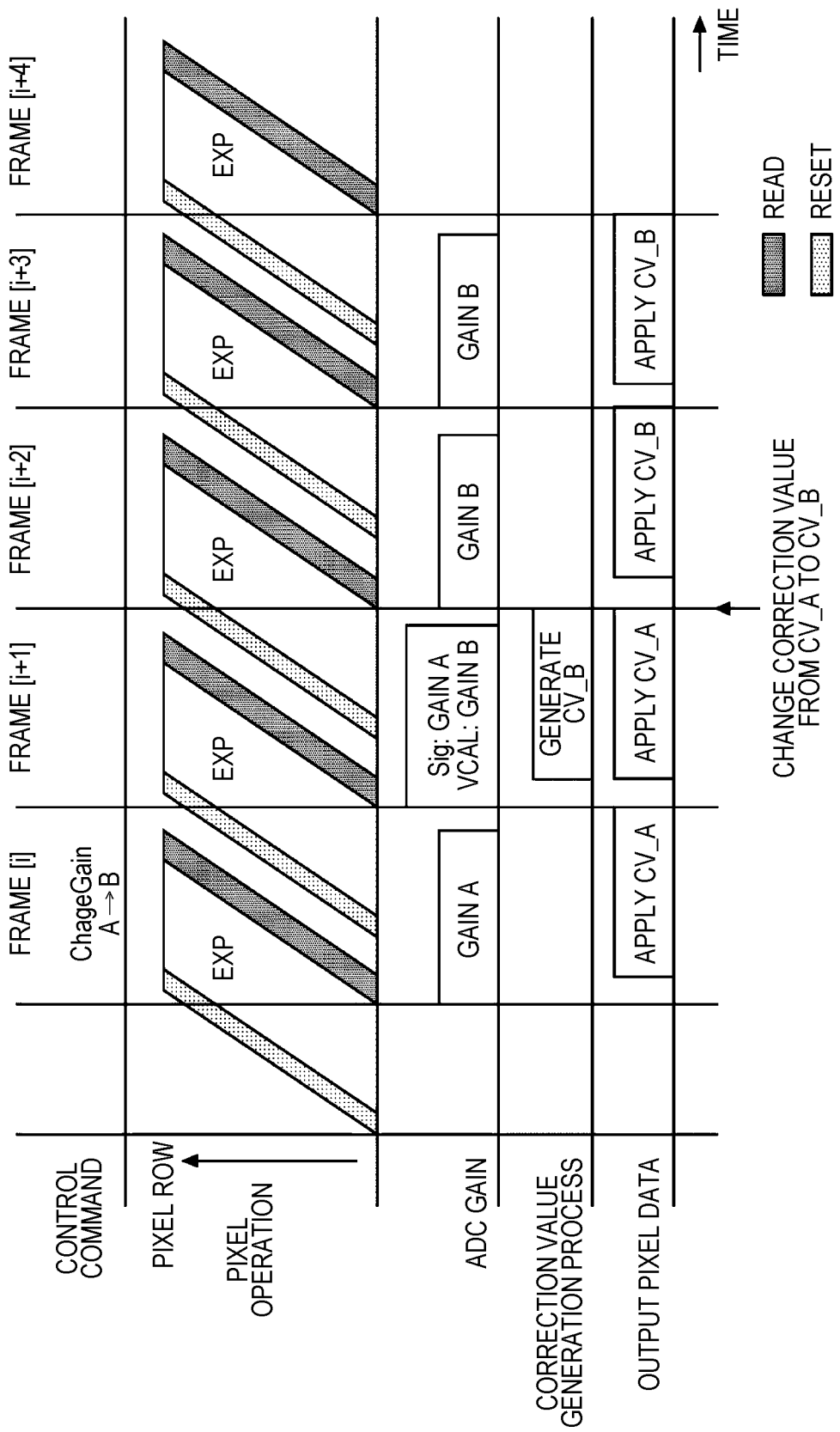
FIG. 12 is a timing diagram explaining the operation of the image sensor according to the first embodiment.

Next, FIG. 12 is a timing diagram explaining the operation of the image sensor according to the first embodiment. As shown in FIG. 12, the image sensor 1 according to the first embodiment obtains an imaging signal Sig from a pixel circuit by providing three instructions to the pixel circuit: reset (RESET in FIG. 12); exposure (EXP in FIG. 12); and readout (READ in FIG. 12). These three operations are sequentially performed in row order on the pixel circuits arranged in a grid within the pixel array area 13 of the image sensor 1 according to the first embodiment. Suppose the three processes required to read out an imaging signal Sig are arranged in chronological order, the operations to read all pixels can be represented as a trapezoid.

In FIG. 12, in a period when an ith frame is being read, a command to change the gain of the analog-digital converter circuit ADC from gain A to gain B is provided as a control command. Then, the image sensor 1 according to the first embodiment, which performs the operations shown in FIG. 12, conducts calibration operation to obtain a correction value to be applied when the gain of the analog-digital converter circuit is changed to gain B. The calibration operation is performed while the i+1st frame, which is the next frame to the ith frame having been read when the gain change command was provided, is being read out. In FIG. 12, the correction value associated with gain A is indicated by CV_A, and the correction value associated with gain B is indicated by CV_B.

The timing of the calibration operation shown in FIG. 12 is merely an example, and the calibration operation can be performed at various times, for example, on startup of the image sensor 1 of the first embodiment, or at regular time intervals.

In the example shown in FIG. 12, the gain of the analog-digital converter circuit is changed while the i+1st frame is being read. More specifically, in calibration operation, the gain of the analog-digital converter circuit is set to gain A to read out imaging signals Sig, and the gain of the analog-digital converter circuit is set to gain B to read out calibration voltages VCAL. In addition, in the calibration operation, a correction value CV_A is applied to the pixel data output by the image sensor 1 according to the first embodiment. Also, in the calibration operation, a correction value CV_B is generated based on calibration data DCAL.

During the process of reading the i+1st frame, the correction value CV_B is completely generated. Subsequently, the correction value CV_A is updated to the correction value CV_B when the process of reading the i+1st frame is changed to the process of reading the i+2nd frame. While the i+2nd frame is being read, the gain of the analog-digital converter circuit is set to gain B, and the correction value CV_B is applied to generate output pixel data.

Figure 13:
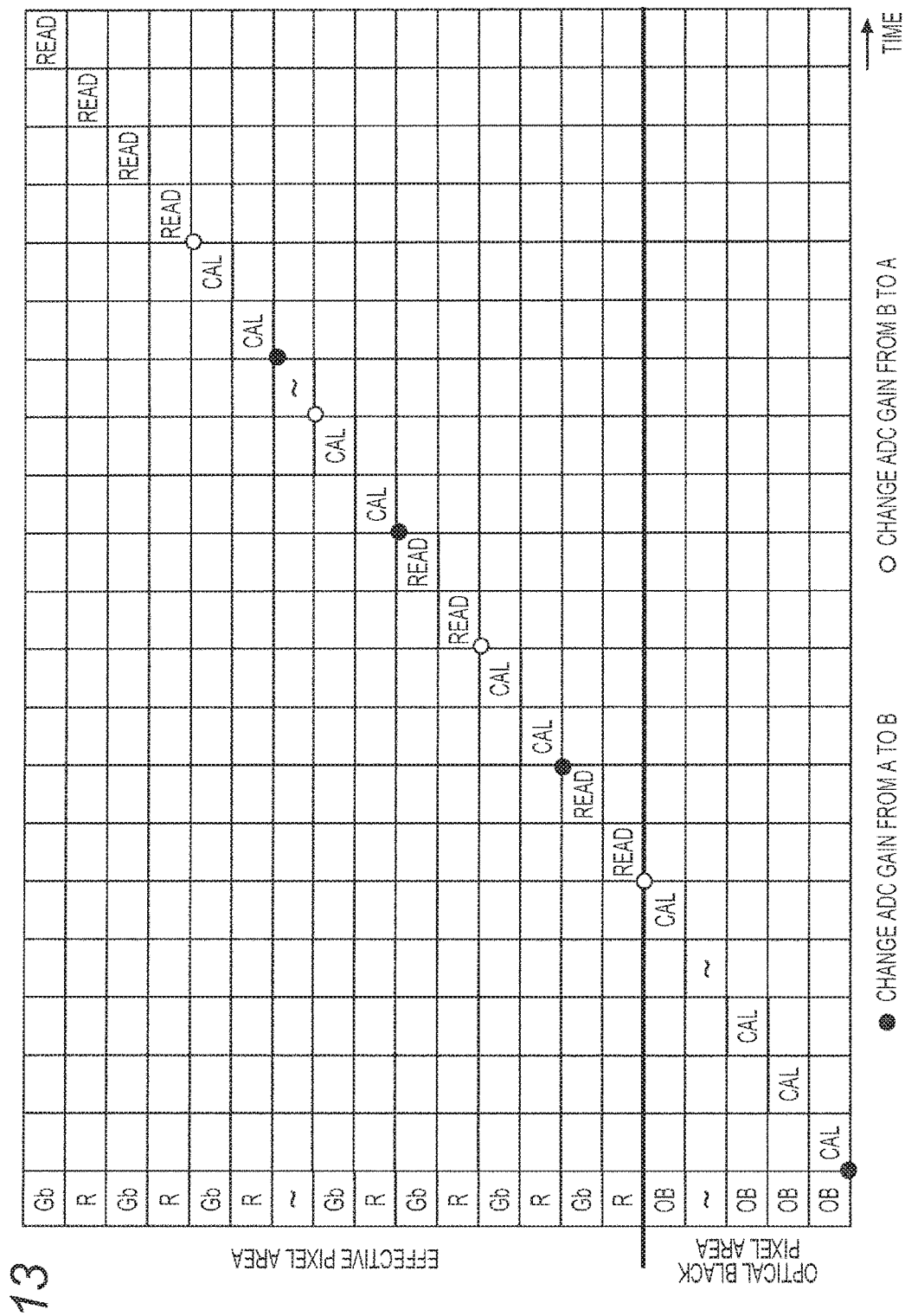
FIG. 13 is a timing diagram explaining a readout process during calibration operation by the image sensor according to the first embodiment.

A detailed description will be made about the readout process during calibration operation. FIG. 13 is a timing diagram explaining the readout process during calibration operation by the image sensor according to the first embodiment.

As shown in FIG. 13, the calibration operation involves a calibration readout process CAL. In the process CAL, a calibration voltage VCAL is read out from pixel circuits arranged in the optical black pixel area which are not target circuits from which imaging signals Sig are read out. On the other hand, pixel circuits in the effective pixel area are target circuits from which imaging signals Sig are read out, and therefore the pixel circuits of the alternately arranged imaging pixel circuit group and calibration pixel circuit group are sequentially read out in row order. This pixel signal Sig readout process READ and the calibration readout process CAL are repeatedly performed at predetermined intervals (e.g., every two rows). In the calibration operation, the gain of the analog-digital converter circuit is changed from gain A to gain B when the pixel signal Sig readout process READ is changed to the calibration readout process CAL. In addition, the gain of the analog-digital converter circuit is changed from gain B to gain A when the calibration readout process CAL is changed to the pixel signal Sig readout process READ.

Figure 14:
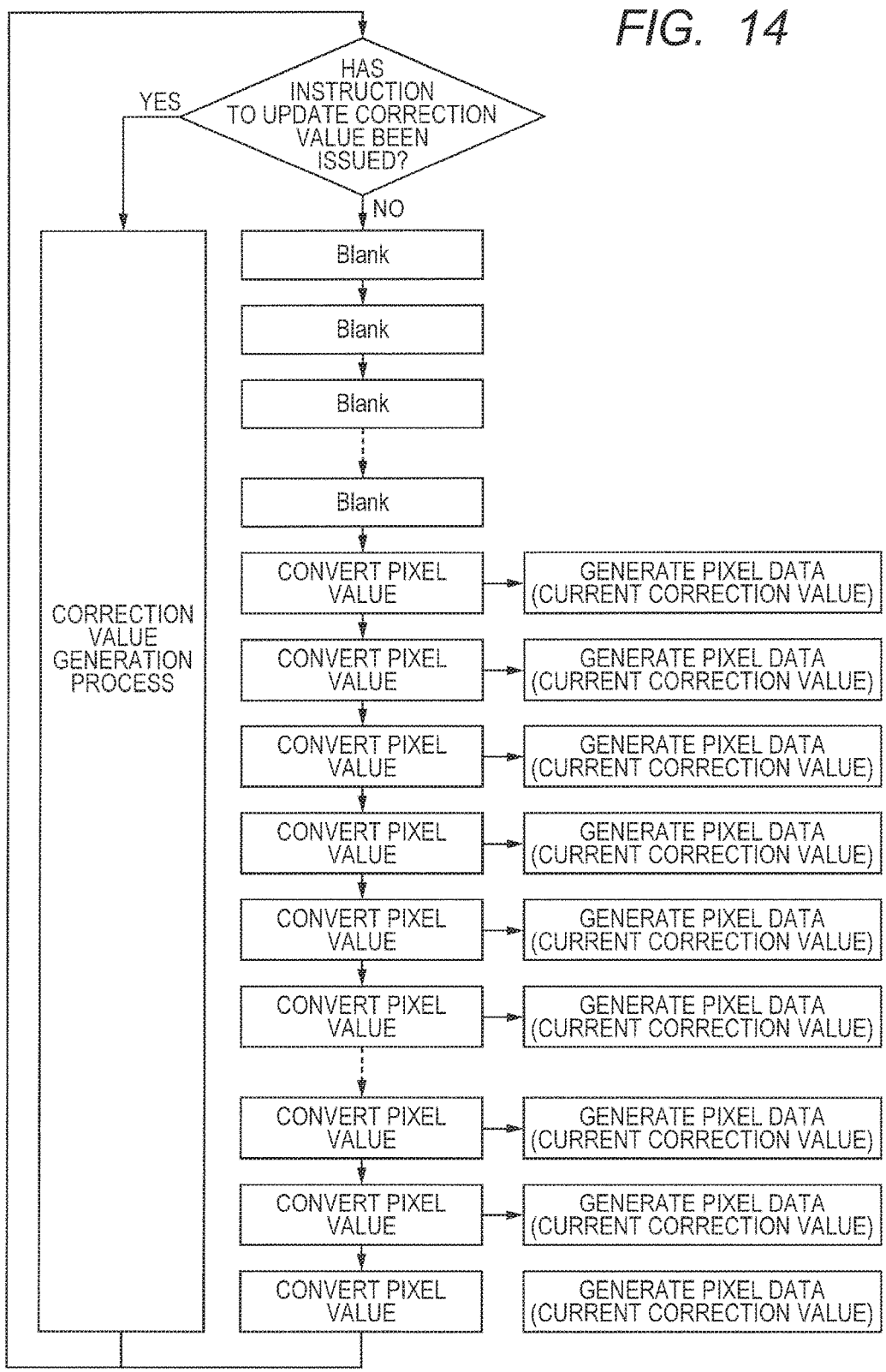
FIG. 14 is a flowchart explaining the operation of the image sensor according to the first embodiment.

Next, the operation of the image sensor 1 according to the first embodiment will be described with reference to a flowchart. FIG. 14 is the flowchart explaining the operation of the image sensor according to the first embodiment. As shown in FIG. 14, the image sensor 1 according to the first embodiment firstly determines whether an instruction to update a correction value has been issued. The correction-value update instruction is issued, for example, at the time of changing the gain of the analog-digital converter circuit, or at any other times irrespective of the change in gain of the analog-digital converter circuit.

In a case where the correction-value update instruction is absent, a blank process is performed so as not to read out signals from pixel circuits arranged in the optical black pixel area, while a pixel value conversion process of reading out imaging data Dsig and a pixel value generation process of applying a correction value CV to imaging data Dsig to generate pixel data Dpx are sequentially performed in row order on pixel circuits arranged in the effective pixel area.

Figure 15:
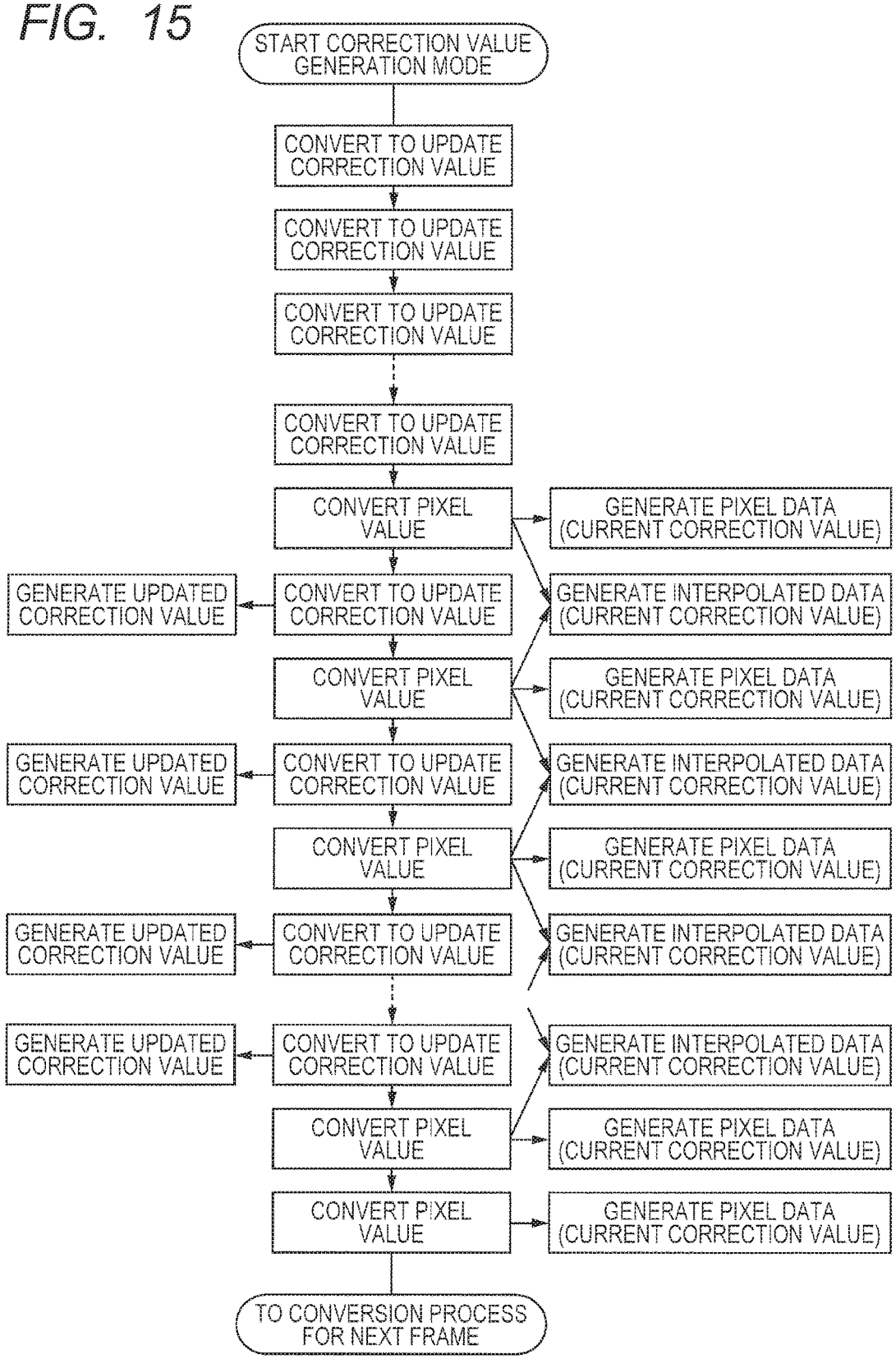
FIG. 15 is a flowchart explaining calibration operation of the image sensor according to the first embodiment.
Figure 16:
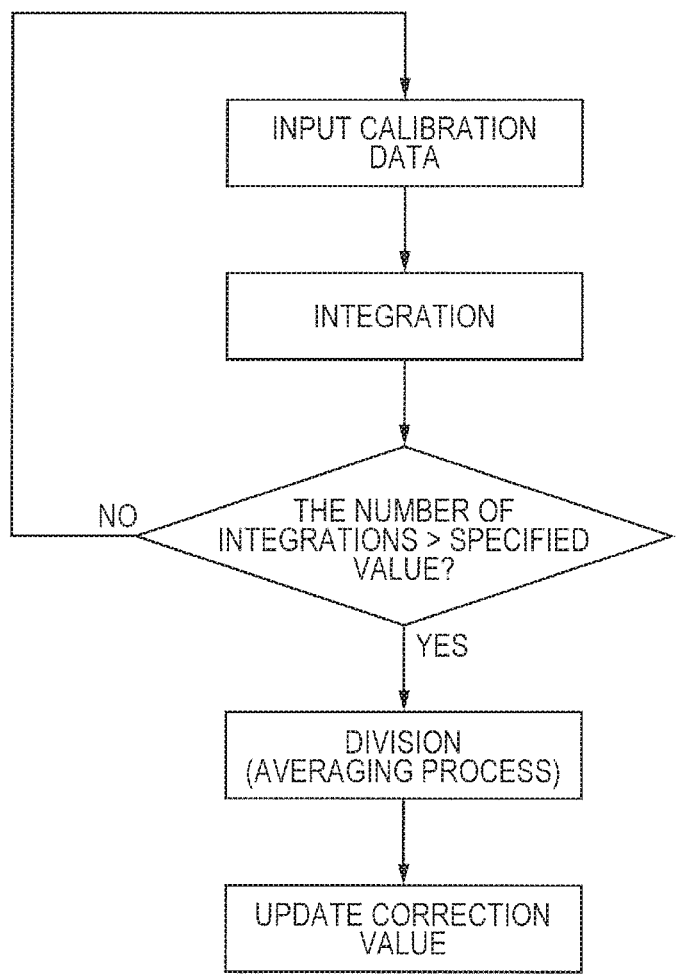
FIG. 16 is a flowchart explaining the operation of a correction value generation process by the image sensor according to the first embodiment.

In a case where a correction value update instruction is present, on the other hand, a correction value generation process is performed to generate a new correction value through calibration operation. FIG. 15 is a flowchart explaining the calibration operation of the image sensor according to the first embodiment. To read out signals from the pixel circuits arranged in the optical black pixel area, as shown in FIG. 15, a conversion process for updating a correction value is performed to read out calibration data DCAL. For the pixel circuits arranged in the effective pixel area, a pixel value conversion process for reading out imaging data Dsig and a conversion process for updating a correction value by reading out calibration data DCAL are performed repeatedly at predetermined intervals. In addition, a pixel data generation process of generating pixel data Dpx by applying the current correction value CV to the imaging data Dsig in association with the pixel value conversion process, and an interpolated-data generation process of interpolating the missing pixel data Dpx by acquiring calibration data DCAL are sequentially performed row by row. Then, a process for generating an updated correction value is performed in association with the conversion process for updating a correction value. FIG. 16 is a flowchart of the conversion process for updating a correction value.

As shown in FIG. 16, the conversion process for updating a correction value repeats input of calibration data DCAL and integration of the input calibration data DCAL until the number of the integrated calibration data pieces DCAL reaches or exceeds a specified value. In response to the event in which the number of the calibration data pieces DCAL integrated exceeds the specified value, the integrated calibration data DCAL is smoothed (e.g., divided). This smoothing process provides an updated correction value, and the current correction value is updated to the updated correction value.

As can be seen from the above, the image sensor 1 according to the first embodiment alternately performs a process of reading out calibration data DCAL and a process of reading out imaging data Dsig while imaging data Dsig for one frame is being read out. This allows the image sensor 1 to acquire more pieces of calibration data DCAL within a shorter time period than the case where calibration data DCAL is acquired only within a readout period of pixel circuits arranged in the optical black pixel area.

The analog CDS method requires a large number of calibration data pieces DCAL in order to increase the accuracy of a correction value. The correction value needs to be updated because an amount of noise, such as an offset on the path through which an imaging signal Sig is read out, changes at the startup of the image sensor 1 according to the first embodiment, or when the gain of the analog-digital converter circuit is changed. The image sensor 1 according to the first embodiment can generate a highly-accurate correction value at an early stage by collecting a large number of calibration data pieces DCAL for a short time. Such an image sensor 1 according to the first embodiment capable of acquiring a highly-accurate correction value for a short time can cut the time required for gain change and initial startup processing.

For instance, in the case of a 2 k image with 1024 rows in a frame, the image sensor 1 according to the first embodiment can acquire 512 or more calibration data pieces DCAL within a frame period. In the case of a 4 k image with 2048 rows in a frame, the image sensor 1 according to the first embodiment can acquire 1024 or more calibration data pieces DCAL within a frame period. Such an image sensor 1 according to the first embodiment capable of acquiring calibration data pieces DCAL sufficient enough to acquire accurate correction values within a frame period can possibly change gain two frames after issue of a gain change command. If, for reference, 1024 calibration data pieces DCAL are attempted to be acquired only from the pixel circuits arranged in the optical black pixel area, it takes 32 frames to change gain. This example proves how fast the image sensor 1 according to the first embodiment can update a correction value.

The image sensor 1 according to the first embodiment performs an inter-row interpolation process to interpolate pixel data Dpx that was left out during acquisition of calibration data DCAL. This allows the image sensor 1 according to the first embodiment to continuously generate frames without interruption even during calibration operation.

Second Embodiment

The second embodiment describes an example of applying the calibration operation described in the first embodiment to an image sensor that performs a high dynamic range (HDR) process for acquiring wide dynamic range image data by calibrating two pixel data pieces obtained through two different lengths of exposure.

Figure 17:
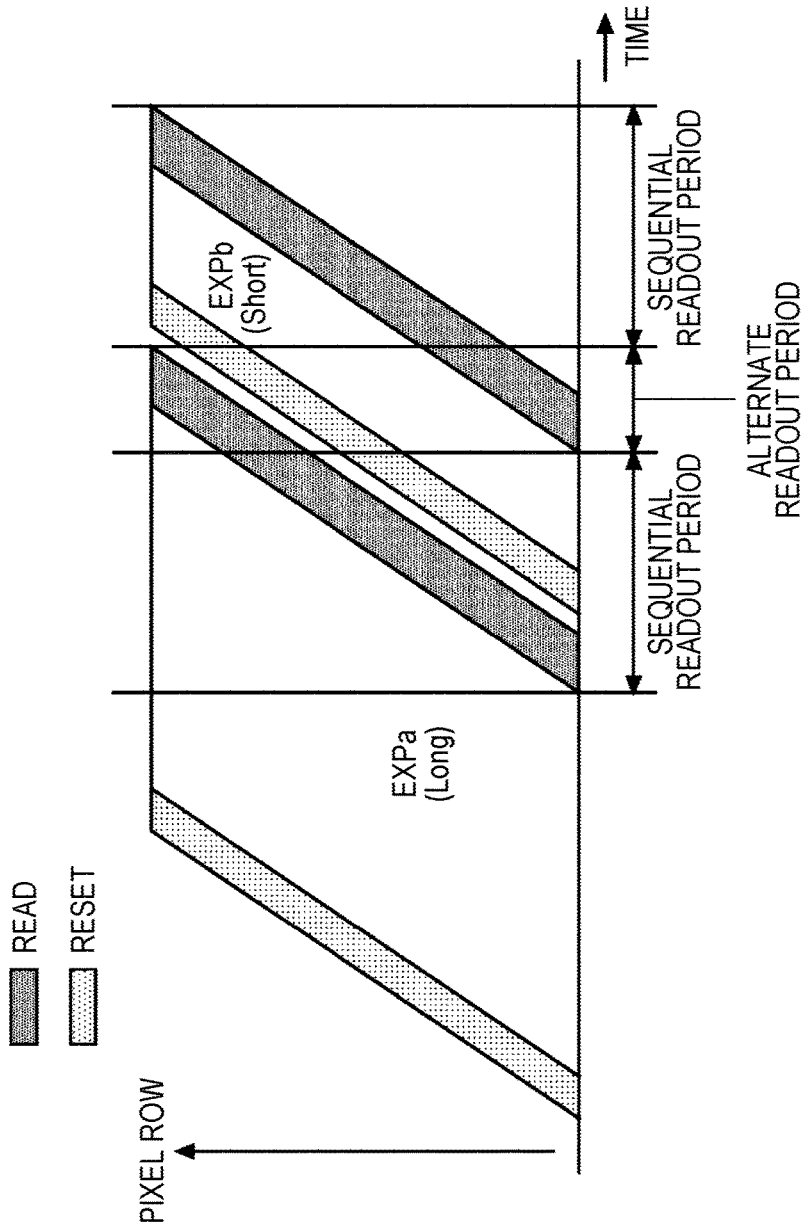
FIG. 17 is a timing diagram explaining the operation of the image sensor according to the second embodiment.

First, a description will be given about how to read out pixel signals Sig when performing HDR processing. FIG. 17 is a timing diagram explaining the operation of the image sensor according to the second embodiment. The timing diagram shown in FIG. 17 represents a process that is performed to obtain imaging data for one frame. As shown in FIG. 17, the image sensor capable of performing the HDR processing acquires two pixel data pieces Dpx for one frame. The two pixel data pieces Dpx are obtained by exposing a pixel to light for different lengths of time. In the example shown in FIG. 17, pixel signals Sig generated by exposing pixels to light for a long exposure time (EXPa in FIG. 17) are firstly obtained, then the pixels from which the long-exposure pixel signals Sig have been obtained are sequentially exposed to light for a short exposure time, and the short-exposure pixel signals Sig are read out in sequence after completion of the exposure operation.

Such double exposure involves a sequential readout period in which the long-exposure pixel signals Sig and short-exposure pixel signals Sig are read out in sequence in row order, and an alternate readout period in which the long-exposure pixel signals Sig and short-exposure pixel signals Sig are read out alternately.

In the sequential readout period, imaging signals Sig are read out in the same readout sequence as described in the first embodiment in both normal operation and calibration operation. On the contrary, in the alternate readout period, the imaging signals Sig are readout in a different processing sequence from the readout process in the first embodiment. The processing sequence of the readout process according to the second embodiment will be described below.

Figure 18:
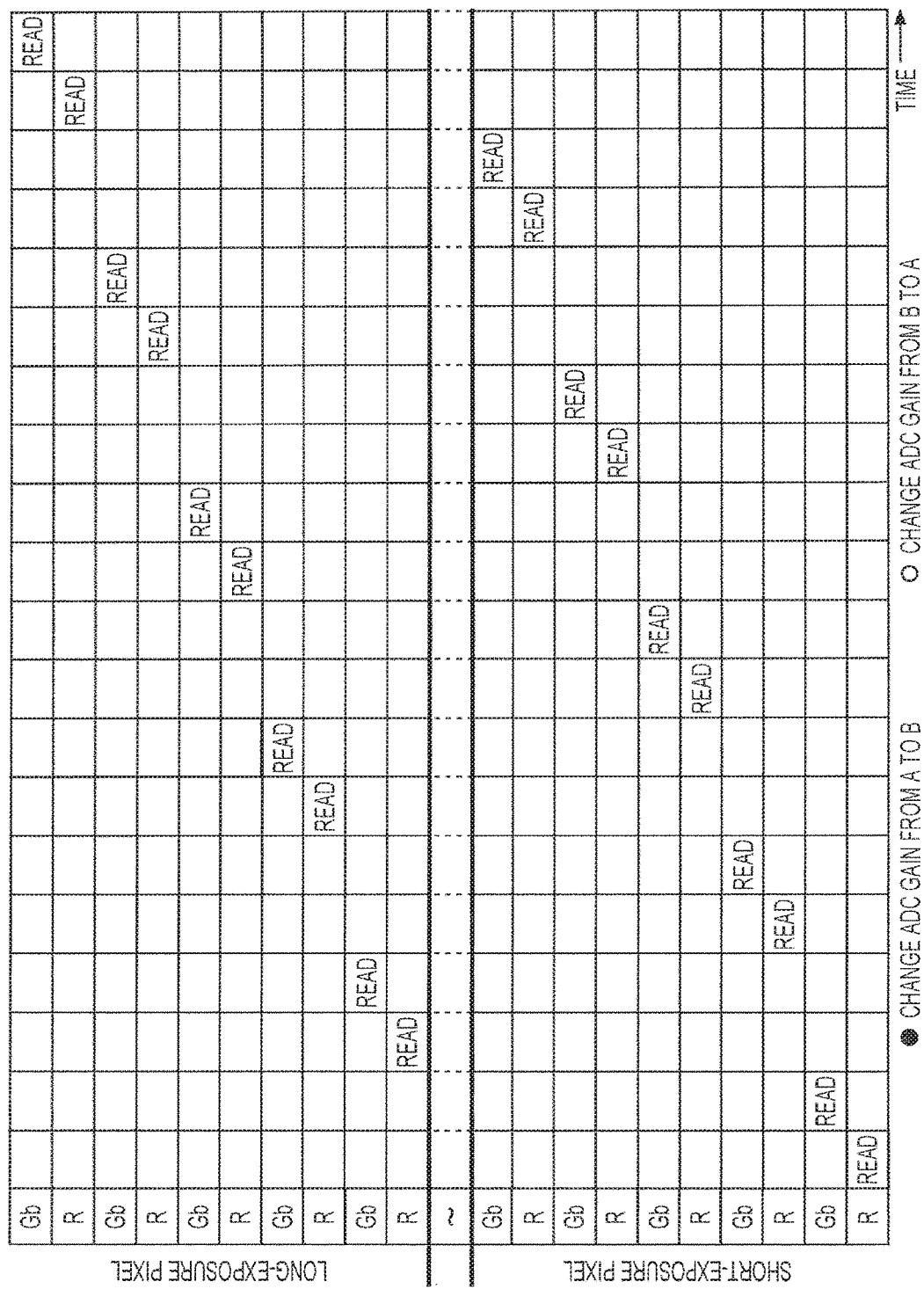
FIG. 18 is a timing diagram explaining a readout process during normal operation by the image sensor according to the second embodiment.

FIG. 18 is a timing diagram explaining the readout process during normal operation by the image sensor according to the second embodiment. As shown in FIG. 18, the normal operation in the alternate readout period is to alternately perform a process of reading pixel circuits that output long-exposure pixel signals Sig, and a process of reading pixel circuits that output short-exposure pixel signals Sig (READ in FIG. 18). In addition, the gain of the analog-digital converter circuit is not changed in normal operation.

Figure 19:
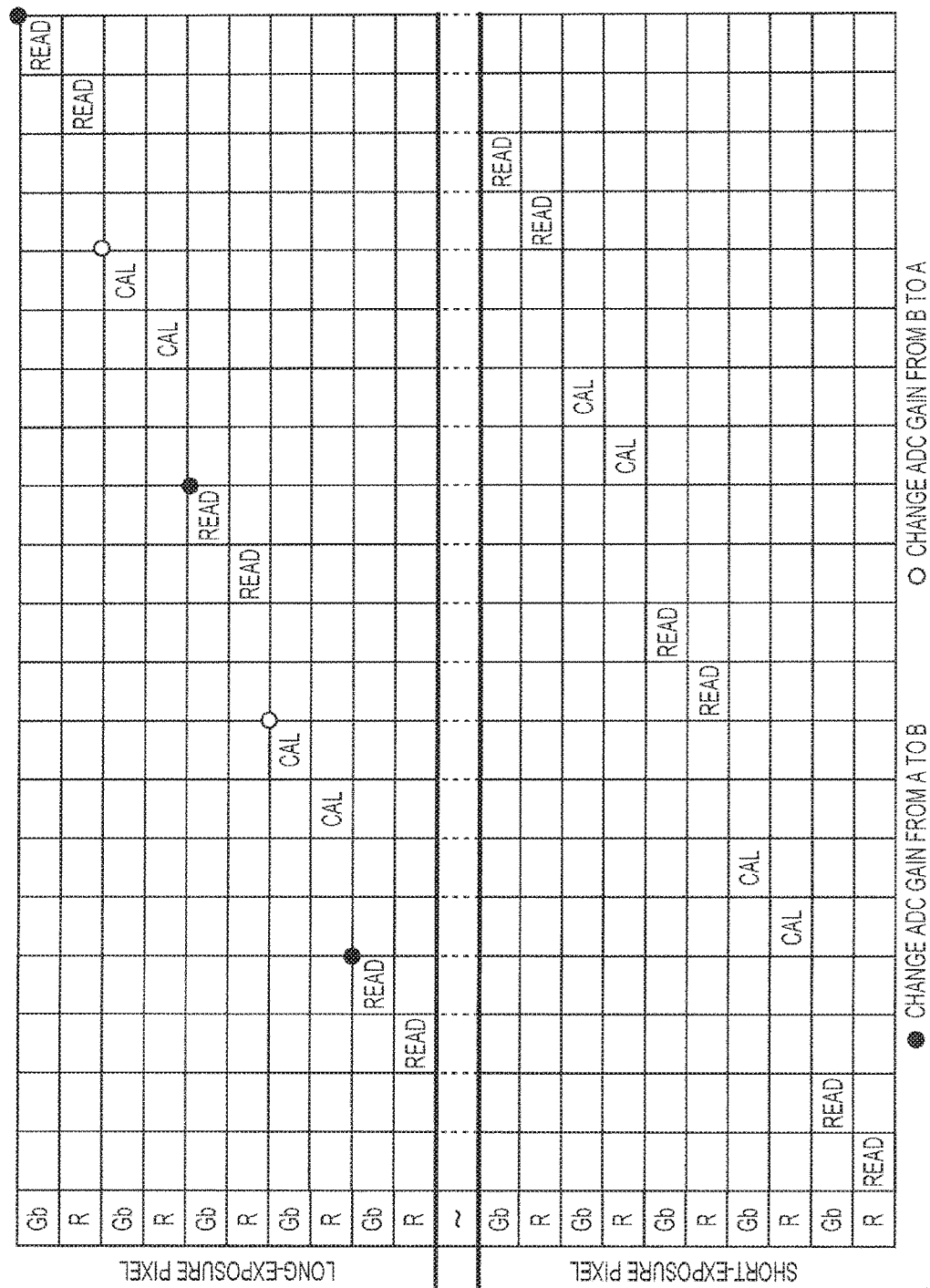
FIG. 19 is a timing diagram explaining a readout process during calibration operation by the image sensor according to the second embodiment.

FIG. 19 is a timing diagram explaining the readout process during calibration operation by the image sensor according to the second embodiment. As shown in FIG. 19, the calibration operation in the alternate readout period is to alternately perform a process of reading pixel circuits that output long-exposure pixel signals Sig, and a process of reading pixel circuits that output short-exposure pixel signals Sig (READ and CAL in FIG. 19). Focusing on the long-exposure pixels and short-exposure pixels separately, the process of reading out the pixel signals Sig (READ in FIG. 19) and the process of reading the calibration data DCAL (CAL in FIG. 19) are repeated at predetermined intervals. In addition, as shown in FIG. 19, the process CAL of reading the calibration data DCAL from the short-exposure pixels and the process CAL of reading out the calibration data DCAL from the long-exposure pixels are performed after completion of the process READ of reading out the imaging signals Sig from the short-exposure pixels and the process READ of reading out the imaging signals Sig from the long-exposure pixels in the alternate readout period.

The above-described readout sequence enables generation of the interpolation pixel data Dpx_LIC through the interpolation process performed by the inter-row interpolation processing unit 33.

The foregoing description demonstrates that the calibration operation explained in the first embodiment can be applied to the image sensor performing HDR processing using multiple exposure.

While the invention made by the present inventors has been described concretely with reference to the foregoing embodiments, it goes without saying that the present invention is not limited to the embodiments and that various modifications can be made without departing from the gist of the invention.

What is claimed is:

1. An image sensor performing normal operation to read out imaging signals from a grid of a plurality of pixel circuits arranged in columns and rows, the imaging signals having a voltage level proportional to an exposure on photoelectric conversion elements in the pixel circuits, and calibration operation to generate a correction value to be applied equally to the imaging signals output from the pixel circuits aligned in the same rows, the image sensor comprising:
   a plurality of vertical readout lines coupled to the pixel circuits aligned in the same columns;
   a pixel clipping circuit provided to each of the vertical readout lines, and supplying a calibration voltage to the associated vertical readout line;
   a timing generator controlling the pixel clipping circuit and the pixel circuits to output the imaging signals from the pixel circuits in numeric order of the rows;
   a plurality of analog-digital converter circuits each generating imaging data having a digital value corresponding to a voltage level of the imaging signal input through the associated vertical readout line and generating calibration data having a digital value corresponding to a voltage level of the calibration voltage;
   a pixel data generation unit generating pixel data by applying the correction value to the imaging data; and
   a correction value generation unit accumulating the calibration data, generating an updated correction value using a predetermined number of the accumulated calibration data pieces, and updating the correction value to the updated correction value,
   wherein the pixel circuits are arranged in an effective pixel area that is exposed to incident light through lenses,
   wherein, in the calibration operation, the timing generator categorizes the pixel circuits by row into an imaging pixel circuit group and a calibration pixel circuit group, and controls the pixel circuits belonging to the imaging pixel circuit group to output the imaging signals, and, at the time when the pixel circuits belonging to the calibration pixel circuit group are read, electrically cuts off the pixel circuits belonging to the calibration pixel circuit group from the vertical readout lines, and controls the pixel clipping circuit to supply the calibration voltage to the vertical readout lines.

2. The image sensor according to claim 1,
   wherein each of the imaging pixel circuit group and the calibration pixel circuit group includes at least two pixel circuits that are arranged in the same column and the contiguous rows, and
   wherein the imaging pixel circuit group and calibration pixel circuit group are alternately arranged.

3. The image sensor according to claim 2,
   wherein color filters provided to the pixel circuits belonging to the imaging pixel circuit group is arranged in the same pattern as color filters provided to the pixel circuits belonging to the calibration pixel circuit group.

4. The image sensor according to claim 1, comprising:
   an interpolation pixel data generation unit generating the pixel data associated with the pixel circuit belonging to the calibration pixel circuit group by synthesizing the pixel data associated with the pixel circuits that belong to the imaging pixel circuit group and are arranged around the pixel circuit belonging to the calibration pixel circuit group, and outputs the generated pixel data as interpolation pixel data; and
   a selector outputting the pixel data in synchronization with the timing at which the pixel circuits belonging to the imaging pixel circuit group output data, while outputting interpolation pixel data in synchronization with the timing at which the pixel circuits belonging to the calibration pixel circuit group output data.

5. The image sensor according to claim 4,
   wherein the interpolation pixel data generation unit generates the interpolation pixel data using a plurality of the pixel data pieces output from a plurality of the pixel circuits that belong to the imaging pixel circuit group and have color filters of the same color as that of the pixel circuit associated with the interpolation pixel data.

6. The image sensor according to claim 5,
   wherein the interpolation pixel data generation unit applies a weighting factor to the pixel data to be used to generate the interpolation pixel data, the weighting factor decreasing as the distance from the pixel circuit belonging to the calibration pixel circuit group increases.

7. The image sensor according to claim 1,
   wherein the calibration operation is initiated in response to an instruction to change the gain of the analog-digital converter circuits from a first gain to a second gain,
   wherein the analog-digital converter circuits are controlled to operate at the first gain when to output the imaging data, while operating at the second gain when to output the calibration data, and wherein the analog-digital converter circuits perform an analog-digital conversion process on the imaging data at the second gain after the correction value is overwritten with the updated correction value.

* * * * *